(12) United States Patent
Yamada et al.

(10) Patent No.: US 7,482,737 B2
(45) Date of Patent: Jan. 27, 2009

(54) ALUMINUM NITRIDE THIN FILM, COMPOSITE FILM CONTAINING THE SAME AND PIEZOELECTRIC THIN FILM RESONATOR USING THE SAME

(75) Inventors: Tetsuo Yamada, Ube (JP); Keigo Nagao, Ube (JP); Eiji Masui, Ube (JP)

(73) Assignee: UBE Industries, Ltd., Yamaguchi (JP)

( * ) Notice: Subject to any disclaimer, the term of this patent is extended or adjusted under 35 U.S.C. 154(b) by 0 days.

(21) Appl. No.: 11/546,765

(22) Filed: Oct. 12, 2006

(65) Prior Publication Data

US 2007/0080611 A1 Apr. 12, 2007

(30) Foreign Application Priority Data

Oct. 12, 2005 (JP) .............................. 2005-297192

(51) Int. Cl.
*H03H 9/125* (2006.01)

(52) U.S. Cl. .................. 310/363; 310/364; 310/365; 310/366

(58) Field of Classification Search ................ 310/364, 310/363, 365, 366
See application file for complete search history.

(56) References Cited

U.S. PATENT DOCUMENTS

| | | | | |
|---|---|---|---|---|
| 4,370,583 A | * | 1/1983 | Ljung ......................... 310/331 |
| 5,852,229 A | * | 12/1998 | Josse et al. ................ 73/24.06 |
| 6,262,637 B1 | * | 7/2001 | Bradley et al. ............. 333/133 |
| 2004/0012310 A1 | * | 1/2004 | Katakura et al. .......... 310/365 |
| 2005/0099099 A1 | * | 5/2005 | Shearer et al. ............ 310/363 |

FOREIGN PATENT DOCUMENTS

| JP | 60-142607 | | 7/1985 |
|---|---|---|---|
| JP | 2000-244030 | | 9/2000 |
| JP | 2000244030 | * | 9/2000 |
| JP | 2005-073175 | | 3/2005 |

* cited by examiner

*Primary Examiner*—Darren Schuberg
*Assistant Examiner*—Bryan P Gordon
(74) *Attorney, Agent, or Firm*—Frommer Lawrence & Haug LLP; Ronald R. Santucci

(57) ABSTRACT

A piezoelectric thin film resonator has a substrate and a piezoelectric layered structure including a lower electrode, piezoelectric aluminum nitride thin film with c-axis orientation and upper electrode formed on the substrate in this order. The lower electrode are made of a metal thin film including a layer containing ruthenium as a major component having a full-width half maximum (FWHM) of a rocking curve of a (0002) diffraction peak of ruthenium of 3.0° or less. The piezoelectric aluminum nitride thin film formed on the lower electrode has a full-width half maximum (FWHM) of a rocking curve of a (0002) diffraction peak of 2.0° or less.

35 Claims, 4 Drawing Sheets

ALUMINUM NITRIDE THIN FILM, COMPOSITE FILM CONTAINING THE SAME AND PIEZOELECTRIC THIN FILM RESONATOR USING THE SAME

This application claims priority benefits from Japanese Patent Application No. 2005-297192 filed Oct. 12, 2005.

BACKGROUND OF THE INVENTION

1. Field of the Invention

The present invention relates to a piezoelectric thin film used in wide fields and a device to which the piezoelectric thin film is applied, such as a thin film resonator, a thin film VCO (Voltage Control Oscillator), a thin film filter, a duplexer, or various sensors for use in a mobile communication device or the like.

2. Description of the Related Art

Devices using piezoelectric phenomena are used in a wide range of fields. While downsizing and power saving of mobile devices progress, use of SAW (Surface Acoustic Wave) devices as RF and IF filters has been expanding. SAW filters have improved in designs and production techniques to meet users' demands for strict specifications. However, improvements in characteristics of SAW filters are approaching limits as used frequencies rise higher. This necessitates a great technical innovation in both aspects of miniaturization in formation of electrodes and maintenance of stable output. On the other side, in an FBAR (Thin Film Bulk Acoustic Resonator) and SBAR (Stacked Thin Film Bulk Acoustic Wave Resonators and Filters) using thickness vibration of a piezoelectric thin film, a thin film mainly made of piezoelectric material and electrodes for driving the thin film are formed on a thin support film provided on a substrate. These resonators and filters can generate basic resonance at a gigahertz band. If a filter is constituted by an FBAR or SBAR, remarkable downsizing can be achieved, and low loss and wide-band operation are possible. Besides, the FBAR or SBAR can be integrated with a semiconductor integrated circuit. Therefore, future application of FBAR and SBAR to very small devices for mobile phone is expected.

A piezoelectric thin film device such as FBAR and SBAR utilizing an acoustic wave is manufactured as follows. A base film made of a dielectric thin film, conductive thin film or a laminated film thereof is formed on a substrate made of single crystal semiconductor such as silicon or poly-crystalline diamond formed on a silicon wafer, by various thin film forming methods. A piezoelectric thin film is formed on the base film, and further, an upper structure is formed upon necessity. After forming each film or all films, a physical or chemical treatment is carried out on each film, thereby to perform microfabrication and patterning. A bridge structure in which a part positioning below a vibration portion is removed from the substrate is prepared by anisotropic etching. Finally, each one device unit is thereafter separated to obtain a piezoelectric thin film device.

For example, a piezoelectric thin film device disclosed in JP-A-60-142607 is manufactured by forming a base film, a lower electrode, a piezoelectric thin film, and an upper electrode on a substrate, and thereafter by removing a part of the substrate existing below a part of a vibration portion from the back side of the substrate, to form a via hole. Materials for the piezoelectric thin film of the piezoelectric thin film device may include aluminum nitride (AlN), zinc oxide (ZnO), cadmium sulfide (CdS), lead titanate (PT($PbTiO_3$)), lead zirconate titanate (PZT ($Pb(Zr,Ti)O_3$)). In particular, AlN with high propagation speed of the acoustic wave is suitable as a piezoelectric material for a thin film resonator and thin film filter which operate at a high frequency band.

JP-A-2000-244030 discloses a piezoelectric thin film device characterized by a conductive thin film containing titanium and at least one of platinum, iridium, ruthenium and ruthenium oxide as a major component. However, performance of the piezoelectric thin film device is not described herein at all.

JP-A-2005-073175 discloses a piezoelectric thin film resonator in which a layer of ruthenium or ruthenium alloy is included in an upper or lower electrode. However, requirement for the characteristics of the upper and lower electrodes which are necessary for fabricating a high performance piezoelectric thin film resonator are not clarified herein.

SUMMARY OF THE INVENTION

Various examinations have been made to apply an AlN thin film to the FBAR or SBAR. However, a piezoelectric thin film resonator or piezoelectric thin film filter that exhibits sufficient performance at a gigahertz band has not been achieved. There is a strong demand for improvement of an acoustic quality factor (Q-value), temperature coefficient of frequency, and insertion loss of the AlN thin film. Especially, improvement of the acoustic quality factor (Q-value) of the anti-resonance peak on the impedance characteristic is desired. No proposal has been made for a piezoelectric thin film device whose acoustic quality factor (Q-value), wide band operation, and frequency-temperature characteristics are all excellent and which exhibits high performance in resonance characteristics. An electromechanical coupling coefficient is an important parameter which influences performance in constitution of a resonator or filter and depends largely on crystal quality of a piezoelectric thin film to be used.

Hence, the present invention has an object of providing a piezoelectric thin film resonator which attains high electromechanical coupling coefficient, excellent acoustic quality factors (Q-value) of both resonance and anti-resonance, excellent frequency temperature characteristics, and remarkably higher performance in characteristics such as an excellent bandwidth, low insertion loss, and the like in comparison with conventional resonators, while making use of a merit of an AlN thin film allowing high propagation speed of acoustic wave.

The present inventors eagerly studied and discussed effects of material and crystallinity of a lower electrode on crystallinity and orientation of an aluminum nitride thin film which greatly influence resonance characteristics of an FBAR or SBAR. As a result, the present inventors found out that a c-axis oriented aluminum nitride thin film having high crystallinity and high crystal orientation is obtained by using as the lower electrode a metal thin film containing ruthenium as a major component and by forming an aluminum nitride thin film on the metal thin film. On the c-axis oriented aluminum nitride thin film, a full-width half maximum (FWHM) of a rocking curve of a (0002) diffraction peak is 2.0° or less. The inventors further found out that by manufacturing the metal thin film having a particular crystal phase and a particular crystallinity degree, a c-axis oriented aluminum nitride thin film having much higher orientation and crystallinity can be obtained with a full-width half maximum (FWHM) of a rocking curve of 0.8 to 1.6°. Further, the inventors found that a high performance FBAR or SBAR which exhibits excellent band width characteristics and excellent frequency temperature characteristics with low insertion loss can be achieved by using the c-axis oriented aluminum nitride thin film mentioned above. The present invention has thus been approached.

In order to achieve the above object, according to the present invention, there is provided an aluminum nitride thin film with c-axis orientation which is formed in contact with a metal thin film including a layer containing ruthenium as a major component, wherein the layer containing ruthenium as a major component has a full-width half maximum (FWHM) of a rocking curve of a (0002) diffraction peak of ruthenium of 3.0° or less, and the aluminum nitride thin film has a full-width half maximum (FWHM) of a rocking curve of a (0002) diffraction peak of 2.0° or less.

In an aspect of the present invention, the aluminum nitride thin film has the full-width half maximum (FWHM) of the rocking curve of 0.8° or more and 1.6° or less.

In an aspect of the present invention, the aluminum nitride thin film has a thickness of 0.5 μm or more and 3.0 μm or less.

In an aspect of the present invention, the metal thin film has a thickness of 150 nm or more and 450 nm or less.

In order to achieve the above object, according to the present invention, there is provided a composite film comprising the above aluminum nitride thin film, and the metal thin film.

In an aspect of the present invention, a first surface of the metal thin film is in contact with a surface of a substrate made of semiconductor or insulator, and the aluminum nitride thin film is in contact with a second surface of the metal thin film on the opposite side to the first surface.

In an aspect of the present invention, the metal thin film contains a contact layer by which is formed the first surface.

In order to achieve the above object, according to the present invention, there is provided a piezoelectric thin film resonator comprising:

a substrate; and a piezoelectric layered structure including a lower electrode, piezoelectric thin film and upper electrode formed on the substrate in this order so that a vibration space is formed below the piezoelectric layered structure, and a vibration portion including a part of the piezoelectric layered structure corresponding to the vibration space is formed, wherein the piezoelectric thin film and one of the lower and upper electrodes are made of the above composite film.

In an aspect of the present invention, the lower electrode has a layered film constituted by a first layer containing one of a layer containing molybdenum as a major component and a layer containing tungsten as a major and having a thickness d1 and a second layer containing the layer containing ruthenium as a major component and having a thickness d2, and d2 is greater than d1 and (d1+d2) is 150 nm or more and 450 nm or less.

In an aspect of the present invention, assuming that surface roughness of an upper face of the lower electrode which is expressed by RMS variation is denoted by $R_B$ [nm], a tapered angle of an end face of the lower electrode relative to the substrate is $5/R_B°$ or more and $30/R_B°$ or less where the end face of the lower electrode faces the piezoelectric thin film.

In an aspect of the present invention, the upper electrode has a layered film constituted by a third layer containing one of a layer containing molybdenum as a major component and a layer containing tungsten as a major component and having a thickness d3 and a fourth layer containing the layer containing ruthenium as a major component and having a thickness d4, and d4 is greater than d3 and (d3+d4) is 150 nm or more and 450 nm or less.

In an aspect of the present invention, a ratio of a thickness of the upper electrode to a thickness of the lower electrode, (upper electrode thickness)/(lower electrode thickness), is 0.6 or more and 1.5 or less.

In an aspect of the present invention, the piezoelectric thin film and the other of the lower and upper electrodes are made of the above composite film.

In an aspect of the present invention, the vibration portion includes an insulating layer containing as a major component at least one selected from a group of aluminum nitride, aluminum oxynitride, aluminum oxide, silicon nitride, mullite, forsterite, zirconium oxide, hafnium oxide, niobium oxide, and tantalum oxide.

In an aspect of the present invention, the insulating layer is formed in contact with a lower surface of the lower electrode.

In an aspect of the present invention, the insulating layer has a thickness d5 of 25 nm or more and 300 nm or less.

In an aspect of the present invention, the insulating layer is formed in contact with an upper surface of the upper electrode.

In an aspect of the present invention, the insulating layer has a thickness d6 of 40 nm or more and 600 nm or less.

Further, a ratio d6/d5 is preferably 1 or more and 4 or less.

In an aspect of the present invention, the piezoelectric layered structure further includes an internal electrode formed on the piezoelectric thin film and an additional piezoelectric thin film formed on the internal electrode, and the upper electrode is formed on the additional piezoelectric thin film, and wherein the additional piezoelectric thin film and one of the internal and upper electrodes are made of the above composite film.

In an aspect of the present invention, the internal electrode has a layered film constituted by a seventh layer containing one of a layer containing molybdenum as a major component and a layer containing tungsten as a major and having a thickness d7 and a eighth layer containing the layer containing ruthenium as a major component and having a thickness d8, and d8 is greater than d7 and (d7+d8) is 150 nm or more and 450 nm or less.

In an aspect of the present invention, assuming that surface roughness of an upper face of the internal electrode which is expressed by RMS variation is denoted by $R_B'$ [nm], a tapered angle of an end face of the internal electrode relative to the piezoelectric thin film is $5/R_B'°$ or more and $30/R_B°$ or less where the end face of the internal electrode faces the additional piezoelectric thin film.

In an aspect of the present invention, the additional piezoelectric thin film and the other of the internal and upper electrodes are made of the above composite film.

In an aspect of the present invention, an acoustic quality factor (Q value) of an anti-resonance peak on an impedance curve is 1,000 or more.

Further, according to the present invention, there is provided a piezoelectric thin film device having the above piezoelectric thin film resonator. The piezoelectric thin film resonator includes a stacked piezoelectric thin film resonator. The piezoelectric thin film device is not limited to but may be, for example, a VCO (Voltage Control Oscillator), a filter, a duplexer, or the like which comprises the piezoelectric thin film resonator or stacked piezoelectric thin film resonator. These piezoelectric thin film devices are capable of improving remarkably characteristics at a high frequency not lower than 1 GHz.

According to the present invention, a lower electrode is constituted using a metal thin film including a layer containing ruthenium as a major component. Crystallinity and crystal orientation and of a c-axis oriented aluminum nitride thin film formed on the lower electrode is improved remarkably by specifying a crystal orientation and thickness of the lower electrode, and structure of the lower electrode and an insulating layer optionally used. Thus, a c-axis oriented aluminum nitride thin film can be formed with high crystallinity and orientation whose full-width half maximum (FWHM) of a rocking curve of a (0002) diffraction peak is 2.0° or less. Further, an excellent piezoelectric thin film can be formed by setting a tapered angle of an end face of the lower electrode within a predetermined range. As a result, it is possible to improve an acoustic quality factor (Q value) of an anti-resonance peak in an impedance characteristic, which is a problem in a conventional electrode structure. There can be provided accordingly a piezoelectric thin film resonator which has an excellent electromechanical coupling coefficient $k_t^2$ and an excellent acoustic quality factor (Q value). Therefore, performance of a VCO (Voltage Control Oscillator), a filter, and a duplexer constituted by using the piezoelectric thin film resonator can be improved at a high frequency of 1 GHz or more.

DETAILED DESCRIPTION OF THE PREFERRED EMBODIMENTS

Figure 1:
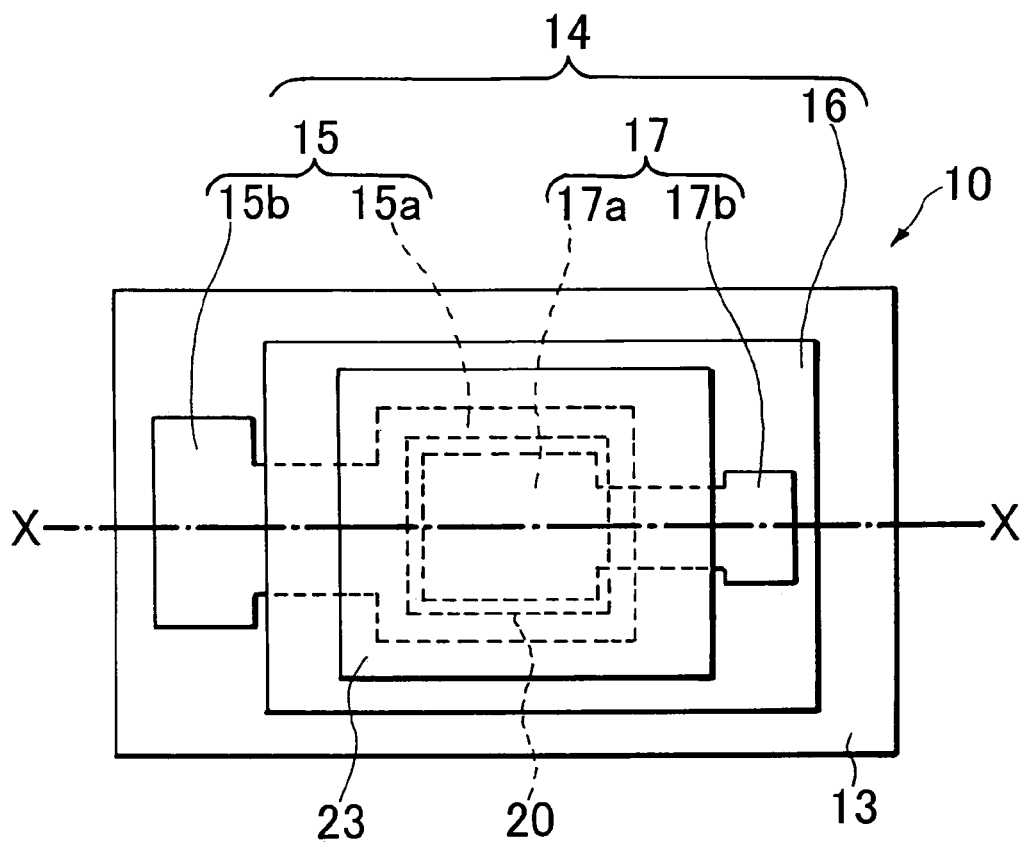
FIG. 1 is a schematic plan view showing the embodiment of a piezoelectric thin film resonator according to the present invention.
Figure 2:
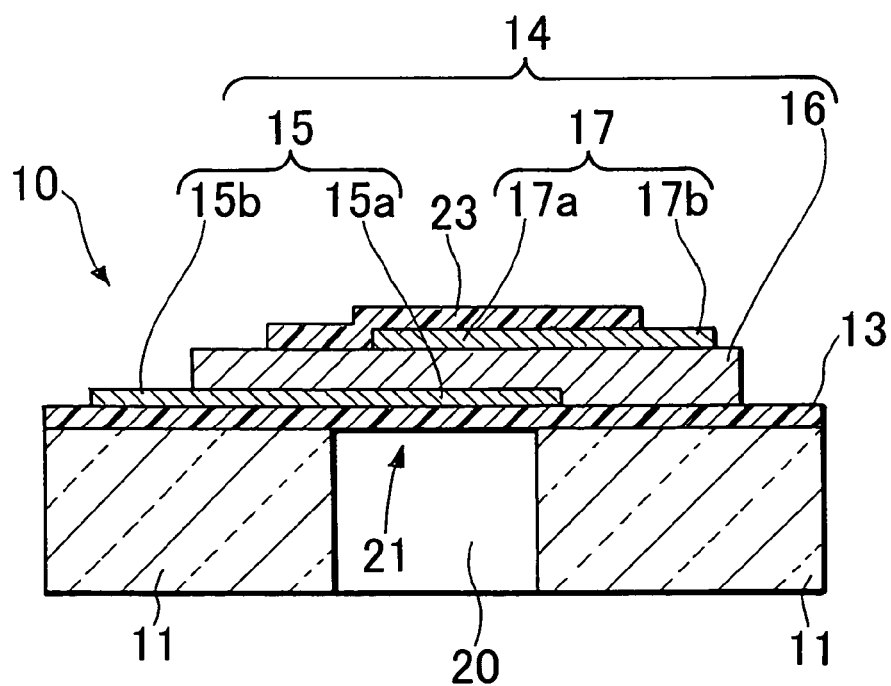
FIG. 2 is a schematic cross-sectional view on X-X line of FIG. 1.

Embodiments of the present invention will now be described hereunder in detail. FIG. 1 is a schematic plan view showing an embodiment of a piezoelectric thin film resonator according to the present invention. FIG. 2 is an X-X cross-sectional view thereof. In these figures, the piezoelectric thin film resonator 10 has a substrate 11, a lower insulating layer 13 formed on an upper surface of the substrate 11, a piezoelectric layered structure 14 formed on an upper surface of the lower insulating layer 13, and an upper insulating layer 17. The piezoelectric layered structure 14 is constituted by a lower electrode 15 formed on an upper surface of the insulating layer 13, a piezoelectric thin film 16 formed on an upper surface of the insulating layer 13 so as to cover a part of the lower electrode 15, and an upper electrode 17 formed on an upper surface of the piezoelectric film 16. A via hole 20 constituting a gap or space (vibration space) is formed in the substrate 11. A part of the lower insulating layer 13 is exposed to the via hole 20. The exposed part of the lower insulating layer 13, a part of the piezoelectric layered structure 14 corresponding to the exposed part, and a part of the upper insulating layer 17 corresponding to the exposed part form a vibration portion (vibration diaphragm) 21. The lower electrode 15 and the upper electrode 17 have main portions 15a and 17a formed in a region corresponding to the vibration portion 21, and terminal portions 15b and 17b for connecting the main portions 15a and 17a to an external circuit. The terminal portions 15b and 17b are positioned outside the region corresponding to the vibration portion 21.

Available as the substrate 11 is a substrate made of single crystal such as Si (100) single crystal, or a substrate in which a poly-crystalline film of silicon, diamond or the like is formed on a surface of a base material of Si single crystal or the like. Another kind of substrate made of a semiconductor or further an insulator is available also as the substrate 11. A method of forming the via hole 20 in the substrate 11 may be a deep etching (Deep RIE) from the side of the lower surface of the substrate. The gap formed in the substrate 11 is not limited to a gap based on the via hole 20. Any gap is available as far as the gap allows the vibration portion 21 to vibrate, e.g., the gap may be formed by a concave portion of the upper surface of the substrate located at a region corresponding to the vibration portion 21.

Available as the lower insulating layer 13 is, for example, a dielectric film containing silicon nitride ($SiN_x$) as a major component, a dielectric film containing aluminum nitride as a major component, a dielectric film containing aluminum oxynitride as a major component, a dielectric film containing aluminum oxide as a major component, a dielectric film containing mullite as a major component, a dielectric film containing forsterite as a major component, a dielectric film containing zirconium oxide as a major component, a dielectric film containing hafnium oxide as a major component, a dielectric film containing niobium oxide as a major component, a dielectric film containing tantalum oxide as a major component, and a layered film constituted by layering these films. With respect to the material of the insulating layer 13, the term of major component means a component contained at a content of 50 equivalent % or more in the dielectric film. The dielectric film may consist of a single layer or a layered structure. Further, the dielectric film may alternatively consist of plural layers obtained by adding a layer to strengthen contact. A thickness d5 of the lower insulating layer 13 is, for example, 25 to 300 nm or preferably 30 to 200 nm. If the thickness of the lower insulating layer 13 is smaller than 25 nm, crystal orientation of a metal thin film formed on the lower insulating layer 13 as the lower electrode 15 containing ruthenium, molybdenum, tungsten, or the like as a major component deteriorates. Consequently, a full-width half maximum (FWHM) of a rocking curve of a corresponding X-ray diffraction peak widens undesirably. On the other hand, if the thickness of the lower insulating layer 13 exceeds 300 nm, an electromechanical coupling coefficient of an obtained piezoelectric thin film resonator lowers so that characteristics thereof deteriorate undesirably.

A method of forming the lower insulating layer 13 on the surface of the substrate 11 made of silicon may be, for example, a sputtering method, a vacuum deposition method, or a CVD method. The present invention may adopt a piezoelectric thin film resonator having a structure in which the lower insulating layer 13 is removed by etching at a region corresponding to the vibration portion 21, thereby to expose the lower electrode 15 to the via hole 20. Since the lower insulating layer 13 is entirely removed from the region corresponding to the vibration portion 21, there is an advantage that the electromechanical coupling coefficient improves although temperature-frequency characteristics at a resonance frequency deteriorate slightly.

The lower electrode 15 is constituted by a metal thin film including at least one of a layer containing ruthenium as a major component, a layer containing molybdenum as a major component, and a layer containing tungsten as a major component. These metal layers may be used alone or in combination. If necessary, a contact layer may be formed between the metal layer and the lower insulating layer 13. The contact layer is a constituent part of the lower electrode 15. Thickness of the lower electrode 15 is preferably 150 nm to 450 nm. In the present invention, as the lower electrode 15, a layered film constituted by a first layer containing one of the metal layer containing molybdenum as a major component and the metal layer containing tungsten as a major component and having a thickness d1 and a second layer containing the metal layer containing ruthenium as a major component and having a thickness d2 formed on the first layer is available. If the contact layer is included in the lower electrode 15 so as to locate between the first layer and the lower insulating layer 13, the thickness d1 of the first layer is a value including the thickness of the contact layer. Employment of such thickness relationships that d2 is greater than d1 and (d1+d2) is 150 nm or more and 450 nm or less can lead to improvement of an acoustic quality factor (Q value) of an obtained piezoelectric thin film resonator. In particular, an acoustic quality factor (Q value) of an anti-resonance peak of an impedance characteristic can be improved. Accordingly, a roll-off characteristic can be improved in a high frequency side of a pass band of a piezoelectric thin film filter manufactured by combining plural piezoelectric thin film resonators.

The piezoelectric thin film 16 is made of aluminum nitride (AlN) and has a thickness of, for example, 0.5 μm to 3.0 μm. The film thickness is increased in case of use at a frequency of 1 GHz or so. The film thickness is decreased in case of use at a high frequency near 5 GHz.

Like the lower electrode, the upper electrode is constituted by a metal thin film including at least one of a layer containing ruthenium as a major component, a layer containing molybdenum as a major component, and a layer containing tungsten as a major component. Further, the upper electrode can utilize, as an alternative for the above metal thin film containing ruthenium, molybdenum or tungsten as a major component, a metal thin film including at least one of a layer containing iridium as a major component, a layer containing aluminum as a major component, a layer containing platinum as a major component, a layer containing tantalum as a major component, and the like, or a layered film constituted by a layer containing ruthenium as a major component and a layer containing molybdenum, tungsten, iridium, aluminum, platinum, or the like as a major component. Further, the upper electrode is constituted by layering, if necessary, a contact layer formed between the metal thin film and the piezoelectric thin film 16. In particular, an acoustic quality factor (Q value) of an obtained piezoelectric thin film resonator can be improved by using a layered film constituted by a layer containing ruthenium as a major component and a layer containing molybdenum or tungsten as a major component.

Thickness of the upper electrode is, for example, 150 nm or more and 450 nm or less. The layer containing ruthenium as a major component means that ruthenium is contained in the layer at 90% or more. This mean is applied also to layer containing molybdenum, tungsten, iridium, aluminum, or platinum as a major component. In the present invention, as the upper electrode 17, a layered film constituted by a third layer containing one of the layer containing molybdenum as a major component and the layer containing tungsten as a major component and having a thickness d3 and a fourth layer containing the layer containing ruthenium as a major component and having a thickness d4 formed on the third layer is available. If the contact layer is included in the upper electrode 17 so as to locate between the third layer and the piezoelectric thin film 16, the thickness d3 of the third layer is a value including the thickness of the contact layer. Employment of such thickness relationships that d4 is greater than d3 and (d3+d4) is 150 nm or more and 450 nm or less can lead to improvement of an acoustic quality factor (Q value) of an obtained piezoelectric thin film resonator. In particular, an acoustic quality factor (Q value) of an anti-resonance peak of an impedance characteristic can be improved. Accordingly, a roll-off characteristic can be improved in a high frequency side of a pass band of a piezoelectric thin film filter manufactured by combining plural piezoelectric thin film resonators.

In general, piezoelectric properties of a piezoelectric material strongly depend on crystal quality such as crystallinity and crystal orientation. With respect to a piezoelectric thin film used in the present invention, the piezoelectric properties are considered to depend on crystal quality such as a grain size, orientation, and crystallinity of crystal forming the piezoelectric thin film. In the present specification, a single orientation film means a crystalline film having crystal planes oriented in parallel with the surface of a substrate. For example, a (0001) single orientation film means a film having a (0001) plane which has grown up in parallel with the surface of the thin film. More specifically, the (0001) single orientation film means such a film in which substantially no reflection peak other than a peak of reflection from a diffraction plane caused by AlN crystal can be detected if X-ray diffraction measurement is carried out. For example, in a (000L) single orientation film, i.e., a c-plane single orientation film, reflection strength other than that of the (000L) plane is 5% or less of maximum peak strength of reflection from the (000L) plane in an X-ray diffraction measurement with θ-2θ rotation, preferably 2% or less, or more preferably a detection limit or less. The (000L) plane is a generic name of planes of (0001) series such as (0001) plane, (0002) plane, (0004) plane, and so forth.

The present inventors have studied and examined how resonance characteristics of the piezoelectric thin film resonator having a structure shown in FIGS. 1 and 2 depend on both the lower electrode, especially material and crystallinity, etc. thereof, and the AlN thin film, especially crystallinity and crystal orientation, etc. thereof. The piezoelectric thin film resonator shown in the figures has a substrate 11 in which a via hole 20 is formed. Layered on the substrate in order written below are: a lower insulating layer 13 containing at least one selected from a group of aluminum nitride, aluminum oxynitride, aluminum oxide, silicon nitride, mullite, forsterite, zirconium oxide, hafnium oxide, niobium oxide, and tantalum oxide as a major component; a lower electrode 15 constituted by a metal thin film including a first layer containing molybdenum or tungsten as a major component and a second layer containing ruthenium as a major component and formed on the first layer, and if necessary, a lower contact layer formed between the first layer and the lower insulating layer 13; an AlN thin film 16 used as a piezoelectric thin film; and an upper electrode 17 constituted by a metal thin film including a third layer containing molybdenum or tungsten as a major component and a fourth layer containing ruthenium as a major component and formed on the third layer, and if necessary, an upper contact layer formed between the third layer and the AlN thin film 16. Further, an upper insulating layer 23 is layered, if necessary, on the upper electrode 17. The upper insulating layer 23 contains at least one selected from a group of aluminum nitride, aluminum oxynitride, aluminum oxide, silicon nitride, mullite, forsterite, zirconium oxide, hafnium oxide, niobium oxide, and tantalum oxide as a major component.

A thickness d5 of the lower insulating layer 13 formed in contact with the lower surface of the lower electrode is 25 nm or more and 300 nm or less, preferably 30 nm or more and 200 nm or less. If the thickness of the lower insulating layer 13 is smaller than 25 nm, crystal orientation of the metal thin film including the layer containing ruthenium, molybdenum, tungsten, or the like as a major component deteriorates. Consequently, a rocking curve half width of a corresponding X-ray diffraction peak becomes broad undesirably. Broad rocking curve half width of the metal thin film used as the lower electrode leads to deterioration in crystal orientation of the AlN thin film to be deposited on the upper surface of the lower electrode. If the thickness of the lower insulating layer 13 exceeds 300 nm, an electromechanical coupling coefficient of an obtained piezoelectric thin film resonator lowers so that piezoelectric characteristics deteriorate undesirably.

A thickness d6 of the upper insulating layer 23 formed in contact with the upper surface of the upper electrode is preferably 40 nm or more and 600 nm or less. Further, the thickness d5 of the lower insulating layer and the thickness d6 of the upper insulating layer are preferably controlled such that a ratio d6/d5 satisfies a relationship of $1 \leq d6/d5 \leq 4$.

Since the upper insulating layer in contact with the upper surface of the upper electrode is formed, spurious signal near a resonance peak of the obtained piezoelectric thin film resonator is reduced. In particular, if d6/d5 satisfies the relationship of $1 \leq d6/d5 \leq 4$, the effect of reduction of spurious signal becomes great. If the thickness d6 of the upper insulating layer formed in contact with the upper surface of the upper electrode is smaller than 40 nm, the effect of suppressing spurious signal undesirably deteriorates remarkably. Inversely, if the thickness d6 of the upper insulating layer formed in contact with the upper surface of the upper electrode exceeds 600 nm, piezoelectric characteristics such as an electromechanical coupling coefficient, acoustic quality factor (Q value), and the like of the obtained piezoelectric thin film resonator deteriorate undesirably. In addition, the upper insulating layer formed in contact with the upper surface of the upper electrode is made of a chemically stable material, resulting in an effect that chemical stability and environmental resistance of the obtained piezoelectric thin film resonator is improved. To raise effects of reducing spurious signal and improving environmental resistance as described above, it is important to improve the crystal orientation of the upper insulating layer formed in contact with the upper surface of the upper electrode. In the present invention, a rocking curve half width of the metal thin film of ruthenium or the like constituting the upper electrode is controlled to 3° or less, to form the upper insulating layer with high orientation. Thus, a good spurious signal reduction effect and excellent environmental resistance can be realized.

The via hole 20 is formed by performing deep etching (Deep RIE (Reactive Ion Etching)) of Si substrate 11 from the lower side in the figure. A thin film layered above the via hole 20 constitutes a diaphragm. In this piezoelectric thin film resonator, the piezoelectric layered structure 14 is constituted by the AlN thin film 16, and the lower electrode 15 and upper electrode 17 sandwiching the AlN thin film 16 above the via hole 20. As described previously, an insulating layer containing at least one selected from aluminum nitride, aluminum oxynitride, aluminum oxide, silicon nitride, mullite, forsterite, zirconium oxide, hafnium oxide, niobium oxide, and tantalum oxide as a major component exists on at least one side of the piezoelectric layered structure 14.

Methods for forming the lower electrode 15 and upper electrode 17 may be, for example, a sputtering method, a vacuum deposition method, and the like.

The lower electrode 15 is formed as follows. A lower contact layer deposited upon necessity, a first layer containing molybdenum or tungsten as a major component, and a second layer containing ruthenium as a major component are formed in this order. Thereafter, these layers are patterned into a predetermined shape using photolithography techniques. In the present invention, positions of the first layer containing molybdenum or tungsten as a major component and the second layer containing ruthenium as a major component can be exchanged with each other to position the layer containing ruthenium as a major component in a lower side. The AlN thin film 16 can be formed by a reactive sputtering method on the upper surface of the substrate 11 where the lower electrode 15 has been formed. For the upper electrode 17, a third layer containing molybdenum or tungsten as a major component and a fourth layer containing ruthenium as a major component are formed in this order. Thereafter, these layers are patterned into a predetermined shape (e.g., a shape similar to a circle) using photolithography technique, as in the case of the lower electrode 15. With respect to the upper electrode, positions of the third layer containing molybdenum or tungsten as a major component and the forth layer containing ruthenium as a major component can be exchanged with each other to position the layer containing ruthenium as a major component in a lower side. After patterning the upper electrode, a part of a region of the AlN thin film 16 except a part above the via hole 20 is removed by etching, using photolithography techniques. In this manner, the AlN thin film 16 is patterned into a predetermined shape.

The present inventors found out that a c-axis oriented aluminum nitride thin film of high crystallinity and high orientation having 2.0° or less of full-width half maximum (FWHM) of a rocking curve of a (0002) diffraction peak is obtained by using a layered structure constituted by a layer containing ruthenium as a major component and a layer containing molybdenum or tungsten as a major component, as the lower electrode 15. The inventors further found out that by preparing the metal thin film with a particular crystal phase or a particular degree of crystal orientation, a c-axis oriented aluminum nitride thin film having much higher crystallinity and crystal orientation can be obtained with the full-width half maximum (FWHM) of the rocking curve of 0.8° or more and 1.6° or less.

That is, the aluminum nitride thin film according to the present invention is a c-axis oriented aluminum nitride thin film formed in contact with a metal thin film of a thickness of 150 nm to 450 nm including a layer formed on a substrate made of semiconductor or insulator and containing ruthenium as a major component. The c-axis oriented aluminum nitride thin film is characterized in that a full-width half maximum (FWHM) of a rocking curve of a (0002) diffraction peak is 2.0° or less. This kind of aluminum nitride thin film has an excellent piezoelectric characteristic, and a piezoelectric thin film resonator using this film has an excellent resonance characteristic of low insertion loss. Further, the layer containing ruthenium as a major component preferably has 3.0° or less of a full-width half maximum (FWHM) of a rocking curve of a (0002) diffraction peak of ruthenium. This enables formation of an aluminum nitride thin film having more excellent c-axis orientation.

The piezoelectric thin film resonator according to the present invention is a resonator as described above, which includes at least: a substrate made of a semiconductor or insulator having a vibration space; and a lower electrode, an aluminum nitride thin film, and an upper electrode layered orderly at a position facing the vibration space of the substrate. The piezoelectric thin film resonator is characterized in that the aluminum nitride thin film is a c-axis oriented aluminum nitride thin film having 2.0° or less of full-width half maximum (FWHM) of a rocking curve of a (0002) diffraction peak, and that at least one of the lower and upper electrodes is a metal thin film having a thickness of 150 nm to 450 nm and including a layer containing ruthenium as a major component.

The layer containing ruthenium as a major component, the layer containing molybdenum as a major component, and the layer containing tungsten as a major component, which are used for the lower electrode 15, are formed by a sputtering method or a vacuum deposition method. These layers containing metal as major components can usually be formed easily by a DC magnetron sputtering method or an RF magnetron sputtering method. However, in case of using the vacuum deposition method, since melting points of the metals are so high (2,310° C. of ruthenium, 2,620° C. of molybdenum, and 3,410° C. of tungsten), manufacturing is difficult with a resistance heating deposition method. An electron beam deposition method is hence necessitated. As for crystal phases, ruthenium is known as a hexagonal system, and molybdenum and tungsten are known as a cubic system. If thin films having these metal crystal phases are formed, a (0002) plane of ruthenium and (110) planes of molybdenum and tungsten tend to grow in parallel with the substrate surface. However, it is difficult for conventional techniques to deposit a metal crystal film having so high orientation that a full-width half maximum (FWHM) of a rocking curve of an X-ray diffraction peak is 3.0° or less. In the present invention, the thickness of an insulating layer to become a base film and a microstructure (crystal orientation and surface roughness) thereof are controlled, and a ultra high vacuum sputtering device (ultimate vacuum: $10^{-6}$ Pa or less or preferably $4 \times 10^{-7}$ Pa or less) is used, to optimize film depositing conditions such as film depositing pressure, film depositing temperature, and DC output or RF output. As a result, a metal crystal thin film having high orientation as described above can be deposited. As an alternative measure to control crystal orientation of the metal thin film, it is effective to change material of a contact layer inserted between a layer containing ruthenium as a major component and the lower insulating layer. As material of the contact layer, titanium, chromium, nickel, or the like is used generally. Further, crystal orientation thereof can be improved by carrying out a heat treatment before film deposition or a pretreatment such as soft etching.

Resistances of the lower and upper electrodes influence loss of resonance characteristics. Therefore, in the present invention, conditions for forming metal thin film are controlled such that specific resistances of the lower and upper electrodes as factors involving loss of an input signal become sufficiently small values. For example, the specific resistances of the electrodes were controlled to be in a range of 5 to 20 μΩ·cm. By setting the specific resistances to values in this range, loss of an inputted high frequency signal is reduced, and excellent resonance characteristics can be realized.

In the present invention, by paying attention to a material, thickness, electric conductivity, acoustic impedance, and crystal orientation of the lower electrode, a relationship was studied and examined in detail between crystal orientation of an aluminum nitride thin film formed on the metal thin film and resonance characteristics of the resultant piezoelectric thin film resonator such as an electromechanical coupling coefficient $k_t^2$ and an acoustic quality factor (Q value) or in particular an acoustic quality factor (Q value) of an anti-resonance peak in impedance characteristic. That is, 2.0° or less of a full-width half maximum (FWHM) of a rocking curve of a (0002) diffraction peak of a c-axis oriented aluminum nitride thin film formed on a metal thin film was obtained by X-ray diffraction, by using as a lower electrode a metal thin film having a thickness of 150 nm to 450 nm and including a layer containing ruthenium as a major component. In this manner, a piezoelectric thin film resonator having high performance can be manufactured with a great electromechanical coupling coefficient $k_t^2$ and with a great acoustic quality factor (Q value).

Further, in the X-ray diffraction measurement of the metal thin film including a layer containing ruthenium as a major component, a full-width half maximum (FWHM) of a rocking curve of a (0002) diffraction peak of ruthenium was controlled to 3.0° or less. As a result of this, a full-width half maximum (FWHM) of a rocking curve of a (0002) diffraction peak of a c-axis oriented aluminum nitride thin film formed on the metal thin film was measured by X-ray diffraction to obtain 2.0° or less. In this manner, a piezoelectric thin film resonator having high performance can be manufactured with a greater electromechanical coupling coefficient $k_t^2$ and with a greater acoustic quality factor (Q value). More preferably, the full-width half maximum (FWHM) of the rocking curve of a (0002) diffraction peak of the ruthenium was controlled to 2.0° or less. As a result of this, a c-axis oriented aluminum nitride thin film having 0.8 to 1.6° of full-width half maximum (FWHM) of the rocking curve of the (0002) diffraction peak is formed on the metal thin film. In this manner, a piezoelectric thin film resonator having high performance can be manufactured with a much greater electromechanical coupling coefficient $k_t^2$ and with a much greater acoustic quality factor (Q value).

Figure 7:
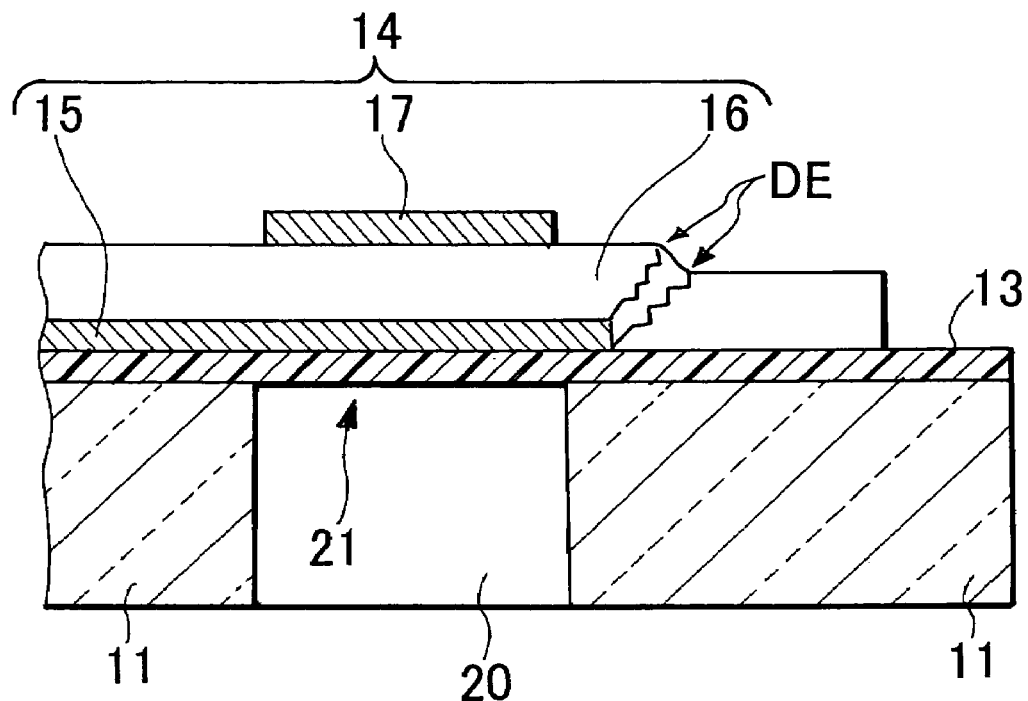
FIG. 7 is a schematic cross-sectional view showing crater-like defect DE by separate growth in an AlN thin film occurring on an end portion of a lower electrode.
Figure 8:
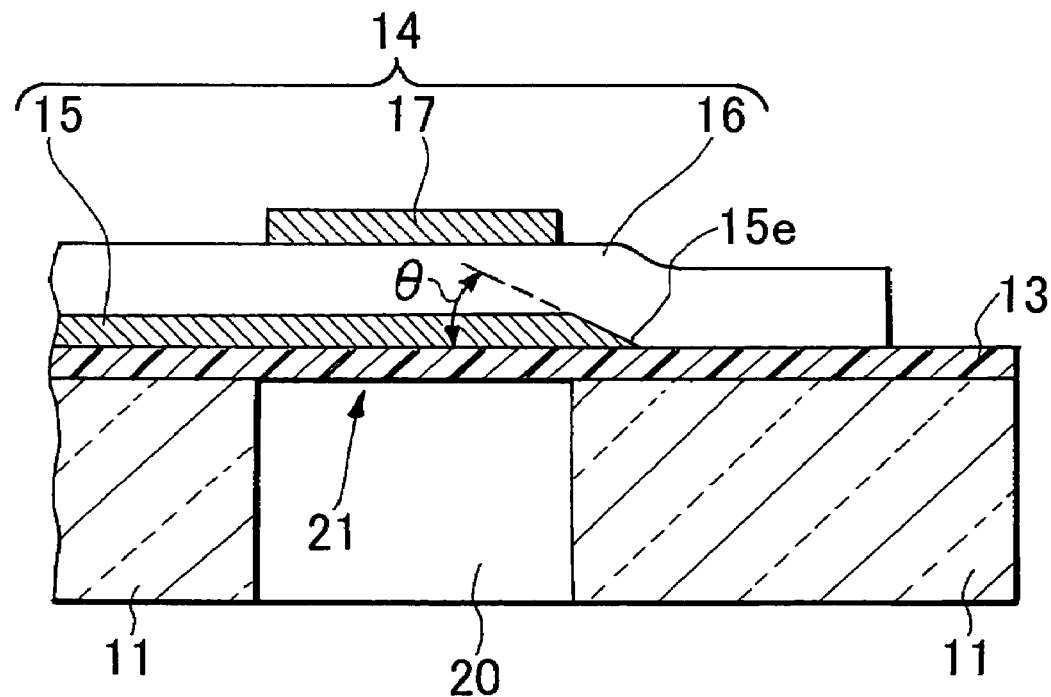
FIG. 8 is a schematic cross-sectional view showing a tapered angle of an end face of the lower electrode.

In the present invention, surface roughness of the upper surface of the lower electrode, which is expressed by RMS variation, is indicated as $R_B$ [nm]. When patterning the lower electrode, the shape of the end portion of the lower electrode is controlled so that an end face of the lower electrode which faces the aluminum nitride thin film has a tapered angle θ of $5/R_B°$ to $30/R_B°$ relative to the substrate. The surface roughness $R_B$ is normally 1 to 4 nm. If the tapered angle θ of the end face of the lower electrode is steep beyond $30/R_B°$, abnormal growth of AlN occurs at an edge portion of the lower electrode end, as shown in FIG. 7, and a deep crater-like defect DE by separate growth occurs between adjacent columnar AlN grains. This crater-like defect DE causes breakdown of the AlN thin film and lowers reliability of a piezoelectric thin film resonator. Therefore, as shown in FIG. 8, the end face 15e of the lower electrode 15 which faces the aluminum nitride thin film 16 needs to be controlled to have a tapered angle θ of $30/R_B°$ or less relative to the substrate 11, to prevent crater-like defect by separate growth. Inversely, if the tapered angle θ of the end face 15e of the lower electrode 15 is gentle to be smaller than $5/R_B°$, a horizontal length of the end face 15e, the tapered portion, is so long that an acoustic quality factor (Q value) of a piezoelectric thin film resonator remarkably deteriorates. Besides, much noise is generated near a resonance peak of an impedance characteristic.

In the piezoelectric thin film resonator shown in FIGS. 1 and 2, a bulk acoustic wave is excited by applying an electric field to the AlN piezoelectric thin film 16 with the upper and lower electrodes 15, 17. Therefore, the lower electrode needs to be exposed in order to make the lower electrode serve as a terminal electrode. This structure can be used only as a resonator. To make a filter, two or more resonators need to be combined. Therefore, if a metal thin film has a high electric resistance, there is a drawback that electric loss caused by wirings increases. Hence, in the present invention, conditions for forming metal thin films are controlled such that specific resistances of the lower and upper electrodes which cause loss of an input signal are sufficiently small values. For example, the specific resistances of the electrodes are controlled to be 5 to 20 μΩ·cm. Then, loss of an inputted high frequency signal is reduced, and excellent filer characteristics can be realized.

Figure 3:
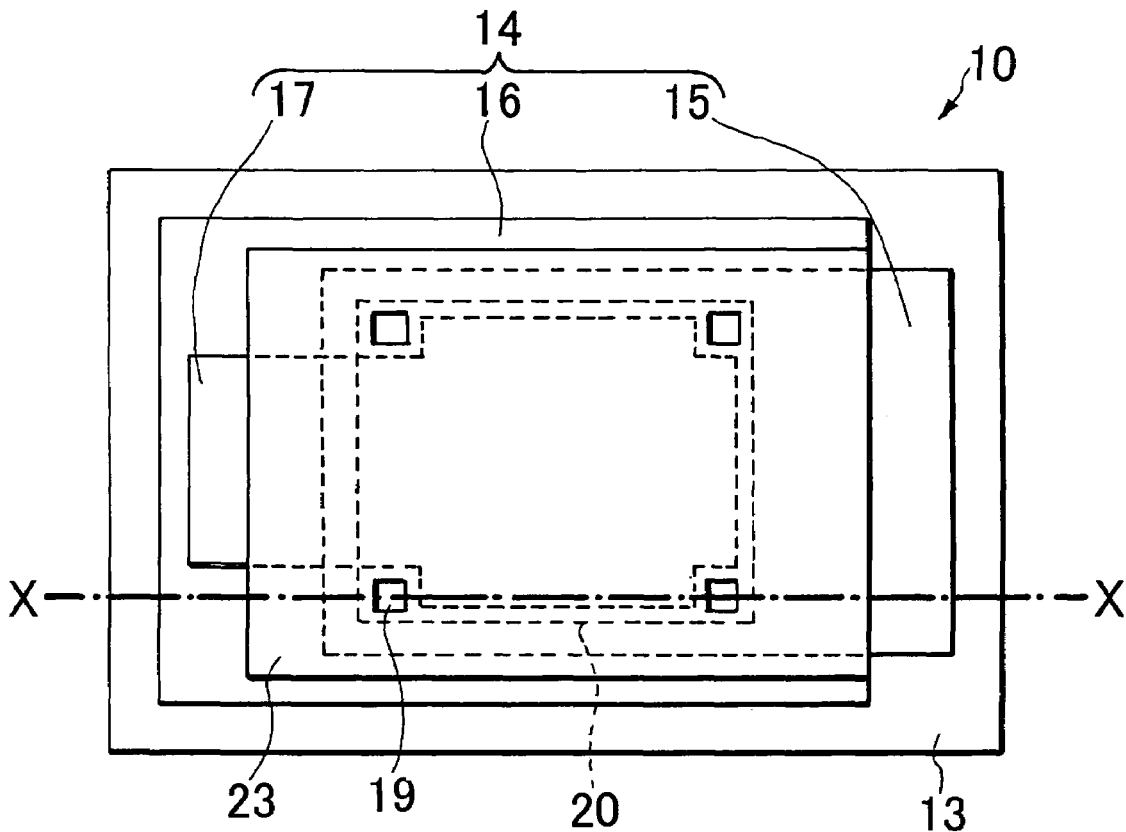
FIG. 3 is a schematic plan view showing another embodiment of the piezoelectric thin film resonator according to the present invention.
Figure 4:
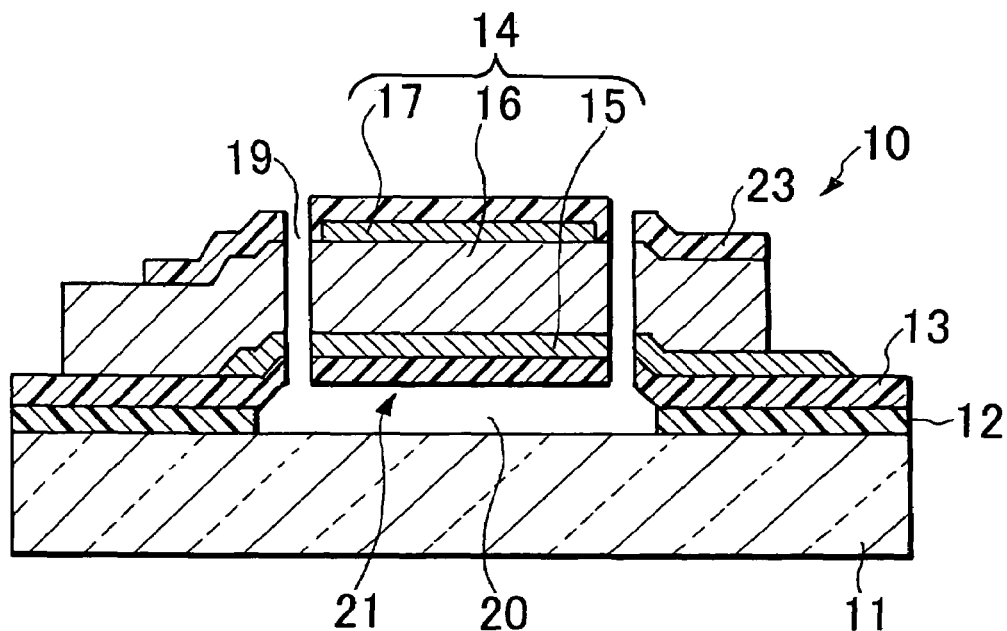
FIG. 4 is a schematic cross-sectional view on X-X line of FIG. 3.

FIG. 3 is a schematic plan view showing another embodiment of the piezoelectric thin film resonator according to the present invention. FIG. 4 is an X-X cross-sectional view thereof. In these figures, those members that have similar functions as those in FIGS. 1 and 2 are denoted by the same reference symbols.

In the present embodiment, a piezoelectric thin film resonator 10 has: a substrate 11; insulating layers 12 and 13 formed on an upper surface of the substrate 11; and a piezoelectric layered structure 14 formed so as to span a vibration space 20 which is formed by removing a part of the insulating layer 12. The piezoelectric layered structure 14 is constituted by: a lower electrode 15 formed on an upper surface of the insulating layer 13; a piezoelectric thin film 16 formed on an upper surface of the insulating layer 13 so as to cover a part of the lower electrode 15; and an upper electrode 17 formed on an upper surface of the piezoelectric thin film 16. The lower electrode 15 has a nearly rectangular shape, and has a main portion 15a (not shown) and a terminal portion 15b (not shown) for connecting the main portion 15a to an external circuit.

The upper electrode 17 has a main portion 17a (not shown) formed within a region corresponding to the vibration space 20, and a terminal portion 17b (not shown) for connecting the main portion 17a to an external circuit. The terminal portions 15b and 17b are positioned outside the region corresponding to the vibration space 20. At least one of the lower electrode 15 and the upper electrode 17 is formed of a metal thin film containing ruthenium as a major component and having a thickness of 150 nm to 450 nm. For example, the lower electrode 15 is made of a metal thin film including a layer containing ruthenium as a major component, and has a thickness of 150 nm to 450 nm. The upper electrode 17 is a layered structure constituted by a layer containing molybdenum as a major component and having a thickness d3 and a layer containing ruthenium as a major component and having a thickness d4. The thicknesses d3 and d4 of the respective layers satisfy relationships of d4/d3>1 and 150 nm≦(d3+d4) ≦450 nm. The insulating layer 13 containing as a major component at least one selected from a group of aluminum nitride, aluminum oxynitride, aluminum oxide, silicon nitride, mullite, forsterite, zirconium oxide, hafnium oxide, niobium oxide, and tantalum oxide is formed in contact with a lower surface of the lower electrode 15. Likewise, an insulating layer 23 containing as a major component at least one selected from a group of aluminum nitride, aluminum oxynitride, aluminum oxide, silicon nitride, mullite, forsterite, zirconium oxide, hafnium oxide, niobium oxide, and tantalum oxide is formed in contact with an upper surface of the upper electrode 17.

A stacked piezoelectric thin film resonator including a piezoelectric thin film resonator according to the present invention can be manufactured using the structure of the piezoelectric thin film resonator according to the present invention. That is, a stacked piezoelectric thin film resonator according to the present invention includes: a substrate made of a semiconductor or insulator having a vibration space; and a lower electrode, an aluminum nitride thin film (a first aluminum nitride thin film), an internal electrode, an additional aluminum nitride thin film (a second aluminum nitride thin film), and an upper electrode which are provided orderly at a position corresponding to the vibration space of the substrate. The stacked piezoelectric thin film resonator is characterized in that the first and second aluminum nitride thin films are c-axis oriented crystal films having 2.0° or less of full-width half maximum (FWHM) of a rocking curve of a (0002) diffraction peak, and that at least one metal electrode of the lower electrode, internal electrode, and upper electrode is a metal thin film containing ruthenium as a major component and having a thickness of 150 nm to 450 nm.

Figure 5:
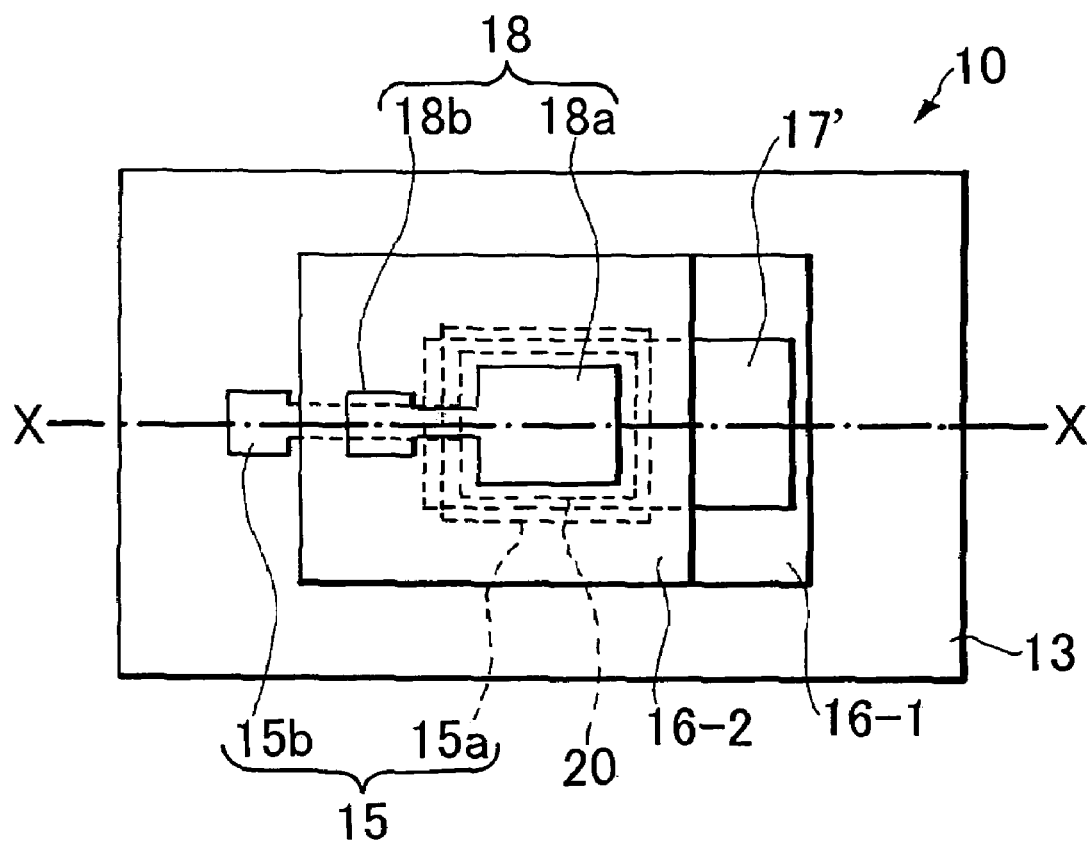
FIG. 5 is a schematic plan view showing still another embodiment of a piezoelectric thin film resonator according to the present invention.
Figure 6:
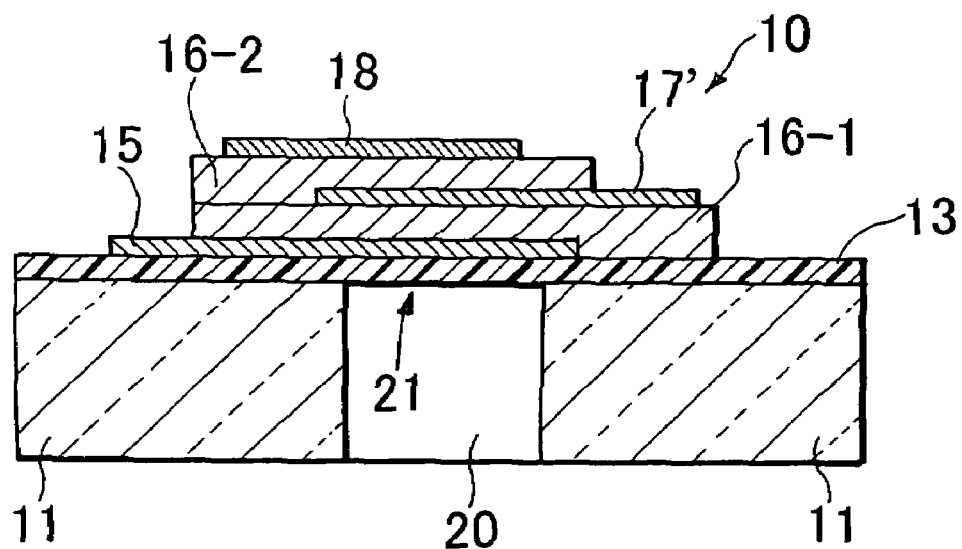
FIG. 6 is a schematic cross-sectional view on X-X line of FIG. 5.

FIG. 5 is a schematic plan view showing still another embodiment of a piezoelectric thin film resonator according to the present invention. FIG. 6 is a cross-sectional view on X-X line of FIG. 5. In these figures, those components that have the same functions as the components shown in FIGS. 1 to 4 are respectively denoted by the same reference symbols.

The present embodiment relates to an SBAR having a piezoelectric layered structure corresponding to layered two piezoelectric layered structures each shown in FIGS. 1 and 2. That is, a lower electrode 15, a piezoelectric thin film (a first piezoelectric thin film) 16-1, an internal electrode 17', an additional piezoelectric thin film (a second piezoelectric thin film) 16-2, and an upper electrode 18 are formed in this order on an insulating layer 13. The internal electrode 17' has both functions as an upper electrode for the first piezoelectric thin film 16-1 and as a lower electrode for the second piezoelectric thin film 16-2. That is, the stacked piezoelectric thin film resonator (SBAR) according to the present invention has a structure including a structure constituted by a lower electrode, a piezoelectric thin film, and an upper electrode, and is also an embodiment of a piezoelectric thin film resonator according to the present invention.

In this embodiment, the internal electrode may have a layered film constituted by a seventh layer containing one of the layer containing molybdenum as a major component and the layer containing tungsten as a major and having a thickness d7 and a eighth layer containing the layer containing ruthenium as a major component and having a thickness d8, wherein d8 is greater than d7 and (d7+d8) is 150 nm or more and 450 nm or less.

In this embodiment, assuming that surface roughness of an upper face of the internal electrode which is expressed by RMS variation is denoted by $R_B'$ [nm], a tapered angle of an end face of the internal electrode relative to the piezoelectric thin film may be $5/R_B'^\circ$ or more and $30/R_B'^\circ$ or less where the end face of the internal electrode faces the additional piezoelectric thin film.

In the present embodiment, an input voltage can be applied between the lower electrode 15 and the internal electrode 17'. A voltage between the internal electrode 17' and the upper electrode 18 can be extracted as an output voltage. Therefore, this structure itself can be used as a multipole filter. By using a multipole filter having a structure described above as a constituent element of a band pass filter, an attenuation characteristic in a rejection band becomes excellent and frequency response characteristics as a filter is improved.

In a piezoelectric thin film resonator as described above, the following relationships exist among a resonance frequency $f_r$, an anti-resonance frequency $f_a$, and an electromechanical coupling coefficient $k_t^2$ in an impedance characteristic measured by using a microwave prober.

$$k_t^2 = \phi_r / \mathrm{Tan}(\phi_r)$$

$$\phi_r = (\pi/2)(f_r/f_a)$$

For simplification, the electromechanical coupling coefficient $k_t^2$ is calculated from the next expression.

$$k_t^2 = 4.8(f_a-f_r)/(f_a+f_r)$$

In piezoelectric thin film resonators or stacked piezoelectric thin film resonators having the structures shown in FIGS. 1 and 2, FIGS. 3 and 4, and FIGS. 5 and 6, the electromechanical coupling coefficients $k_t^2$ obtained from measured values of resonance frequencies and anti-resonance frequencies within a range of 1.5 to 2.5 GHz are 5.4 to 6.9%. If the electromechanical coupling coefficient $k_t^2$ is smaller than 5.4%, a piezoelectric thin film filter manufactured by combining the piezoelectric thin film resonators has a smaller bandwidth so that it is difficult to use the filter practically as a piezoelectric thin film device used at a high frequency band.

According to the present invention, an excellent piezoelectric thin film device having a piezoelectric thin film resonator such as a VCO (Voltage Control Oscillator), a filter, and a duplexer can be provided by using a piezoelectric thin film resonator according to the present invention and a stacked piezoelectric thin film resonator as an embodiment thereof. The piezoelectric thin film device according to the present invention is not limited to the devices described above, but includes any device as far as it has a piezoelectric thin film resonator and a stacked piezoelectric thin film resonator as an embodiment thereof.

EXAMPLES

The present invention will now be described in more detail, referring to examples and comparative examples.

Example 1

In this example, a piezoelectric thin film resonator having a structure shown in FIGS. 1 and 2 was manufactured as follows.

Specifically, an $SiO_2$ layer having a thickness of 1,000 nm was formed by a thermal oxidation method on each of both surfaces of a (100) Si substrate having a thickness of 300 μm. Thereafter, a mask pattern corresponding to the shape of the via hole 20 was formed on a second surface (lower surface) side, and a part of the $SiO_2$ layer which corresponds to the pattern was etched and removed. Simultaneously, all the $SiO_2$ layer in a first surface (upper surface) side was etched and removed. Next, an $Al_2O_3$ thin film having a thickness of 220 nm was formed on the first surface side by a reactive sputtering method. On a first surface of this Si substrate, a Mo thin film having a thickness of 90 nm and an Ru thin film having a thickness of 100 nm were deposited orderly by a DC magnetron sputtering method, to form a lower electrode layer. Further, patterning was carried out by photolithography. In the pattern formation, resist was exposed to intentionally defocused ultraviolet light and was developed to shape the resist into a gentle Quonset-hut-like shape. By giving a gentle taper to end faces of the resist, focus was placed on controlling of tapered angles of end faces of the electrode. Crystal orientation of the lower electrode was evaluated by an X-ray diffraction device to obtain a result that a rocking curve FWHM of a Mo (110) plane was 2.0 deg and a rocking curve FWHM of a Ru (0002) plane was 2.0 deg too. On this Ru/Mo-layered lower electrode, an AlN thin film having a thickness of 1.0 μm was formed using an Al target having purity of 99.999% by a reactive RF magnetron sputtering method under conditions shown in Table 3. Crystallinity of the AlN thin film was evaluated by an X-ray diffraction method to obtain a result that only peaks corresponding to c-planes starting from a (0002) plane were observed and a full-width half maximum (FWHM) of a rocking curve thereof was 1.7° as shown in Table 3. Next, a Mo thin film having a thickness of 265 nm was formed by a DC magnetron sputtering method and was patterned into a nearly rectangular shape having a plan size of 140×160 μm by photolithography, as shown in FIG. 1. Next, the AlN thin film was patterned into a predetermined shape by wet etching using heated phosphoric acid. Further, an $Al_2O_3$ thin film having a thickness of 440 nm was formed on the piezoelectric layered structure by a reactive sputtering method and was patterned by a lift-off method. The surface of the Si substrate on which the upper and lower electrodes, AlN thin film, and upper insulating layer were formed was coated with protect wax. Using as a mask the $SiO_2$ layer having a thickness of 1,000 nm and formed on the second surface of the Si substrate, a portion of the Si substrate which corresponds to a vibration portion was etched by a Deep RIE (Reactive Ion Etching) method of performing deep etching by using an $SF_6$ gas and a $C_4F_8$ gas alternately to form a via hole. Thus, the piezoelectric thin film resonator having the structure as shown in FIGS. 1 and 2 was manufactured. Tables 1 and 2 show the material and thickness of each layer at the vibration portion, a full-width half maximum (FWHM) of a rocking curve of the Ru/Mo-layered lower electrode. Table 3 shows a full-width half maximum (FWHM) of a rocking curve of the AlN thin film.

Further, a GSG micro prober manufactured by Cascade Microtech Inc. and a network analyzer were used to measure impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 2

In this example, a piezoelectric thin film resonator having the structure shown in FIGS. 1 and 2 was manufactured as follows. Specifically, the piezoelectric thin film resonator shown in FIGS. 1 and 2 was manufactured by similar methods to those in Example 1 except that the materials and thicknesses of the lower and upper insulating layers, the forming conditions and thickness of the Ru/Mo-layered lower electrode, and the material and thickness of the upper electrode were changed. Tables 1 and 2 show the material and thickness of each layer at the vibration portion, and a full-width half maximum (FWHM) of a rocking curve of the Ru/Mo-layered lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 3

In this example, a piezoelectric thin film resonator having the structure shown in FIGS. 3 and 4 was manufactured as follows. Specifically, an $SiO_2$ layer having a thickness of 1,500 nm was formed by a thermal oxidation method on each of both surfaces of an Si substrate having a thickness of 625 μm. Thereafter, a Ti thin film having a thickness of 50 nm to become a sacrifice layer was deposited on a first surface (upper surface) of the Si substrate, and a pattern was formed into a desired air bridge shape by photolithography. Next, an AlN thin film having a thickness of 100 nm was formed on the first surface side by a reactive sputtering method. On the first surface of this Si substrate, a Mo thin film and a Ru thin film which had thicknesses shown in Table 1 were deposited orderly by a DC magnetron sputtering method to form a lower electrode layer, which was further patterned by photolithography. In the pattern formation, resist was exposed to intentionally defocused ultraviolet light and was developed to shape the resist into a gentle Quonset-hut-like shape. By giving a gentle taper to end faces of the resist, focus was placed on controlling of tapered angles of end faces of the electrode. Crystal orientation of the lower electrode was evaluated by an X-ray diffraction device to obtain a result that a rocking curve FWHM of a Mo (110) plane was 1.4 deg and a rocking curve FWHM of a Ru (0002) plane was 1.3 deg. On this Ru/Mo-layered lower electrode, an AlN thin film having a thickness of 1.5 μm was formed using an Al target having purity of 99.999% by a reactive RF magnetron sputtering method under conditions shown in Table 2. Crystallinity of the AlN thin film was evaluated by an X-ray diffraction method, to obtain a result that only peaks corresponding to c-planes starting from a (0002) plane were observed and a full-width half maximum (FWHM) of a rocking curve thereof was 1.0° as shown in Table 3. Next, a Ru thin film and a W thin film which had thicknesses shown in Table 1 were deposited orderly by a DC magnetron sputtering method to form an upper electrode layer, which was further patterned by photolithography into a nearly rectangular shape having a plan size of 140×160 μm, as shown in FIG. 3. Next, the AlN thin film was patterned into a predetermined shape by wet etching using heated phosphoric acid. An AlN thin film to become an upper insulating layer, which had a thickness shown in Table 1, was deposited on the upper surface of the Si substrate where the lower and upper electrode and another AlN thin film had been formed, and then patterned. Next, photoresist was coated on the upper surface of the Si substrate, and a via hole pattern to be used for forming a vibration space shown in FIG. 3 was formed in the photoresist. Via holes were opened by dry etching with use of a mixed gas of $Cl_2$ and Ar. Without peeling the photoresist, the lower surface of the Si substrate was coated with photoresist and then the Si substrate was dipped in a diluted hydrofluoric acid solution. By circulation of the solution through the via holes, the Ti sacrifice layer and the $SiO_2$ layer having a thickness of 1,500 nm positioned below the sacrifice layer were removed by etching. The resist was removed by ashing in oxygen plasma, to create the vibration space 20 shown in FIG. 4. Through the manufacturing steps described above, the piezoelectric thin film resonator having the structure shown in FIGS. 3 and 4 was manufactured. Tables 1 and 2 show materials and thicknesses of layers at the vibration portion, a full-width half maximum (FWHM) of a rocking curve of the Ru/Mo-layered lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 4

In this example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the materials and thicknesses of the lower and upper insulating layers, the forming conditions and thickness of the Ru/Mo-layered lower electrode, and the material and thickness of the upper electrode were changed. Tables 1 and 2 show the material and thickness of each layer at the vibration portion, and a full-width half maximum (FWHM) of a rocking curve of the Ru/Mo-layered lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 5

In this example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the materials and thicknesses of the lower and upper insulating layers, the forming conditions and thickness of the Ru/Mo-layered lower electrode, and the material and thickness of the upper electrode were changed. Tables 1 and 2 show the material and thickness of each layer at the vibration portion, and a full-width half maximum (FWHM) of a rocking curve of the Ru/Mo-layered lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 6

In this example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the materials and thicknesses of the lower and upper insulating layers, the forming conditions and thickness of the Ru lower electrode, and the material and thickness of the upper electrode were changed. Tables 1 and 2 show the material and thickness of each layer at the vibration portion, and a full-width half maximum (FWHM) of a rocking curve of the Ru lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 7

In this example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the lower and upper insulating layers were made of $SiN_x$ formed by low pressure CVD method, and the thicknesses of the lower and upper insulating layers, the forming conditions and thickness of the Ru lower electrode, and the material and thickness of the upper electrode were changed. Tables 1 and 2 show the material and thickness of each layer at the vibration portion, and a full-width half maximum (FWHM) of a rocking curve of the Ru lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q. etc. of the obtained piezoelectric thin film resonator.

Example 8

In this example, a piezoelectric thin film resonator having the structure shown in FIGS. 1 and 2 was manufactured as follows. Specifically, the piezoelectric thin film resonator shown in FIGS. 1 and 2 was manufactured by similar methods to those in Example 1 except that the materials and thicknesses of the lower and upper insulating layers, and the materials and thicknesses of the lower and upper electrode were changed. Tables 1 and 2 show the material and thickness of each layer at the vibration portion, and a full-width half maximum (FWHM) of a rocking curve of the Mo lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ and acoustic quality factors Q were obtained from measured values of the resonance frequency $f_r$ and anti-resonance frequency $f_a$. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 9

In this example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the thicknesses of the lower and upper insulating layers, the forming conditions and thickness of the Ru/Mo/Ti-layered lower electrode, and the material and thickness of the upper electrode were changed. Tables 1 and 2 show the material and thickness of each layer at the vibration portion, and a full-width half maximum (FWHM) of a rocking curve of the Ru/Mo/Ti-layered lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$, and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 10

In this example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3, where the lower insulating layer, the lower electrode, and the AlN thin film were formed and patterned, and then the upper electrode was formed. Tables 1 and 2 show the material and thickness of each layer at the vibration portion, and a full-width half maximum (FWHM) of a rocking curve of the Ru/Cr-layered lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$, and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Examples 11 to 14

In each of these examples, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the materials and thicknesses of the lower and upper insulating layers, the material, forming conditions and thickness of the lower electrode, and the material and thickness of the upper electrode were changed. Tables 1 and 2 show the material and thickness of each layer at the vibration portion, and a full-width half maximum (FWHM) of a rocking curve of the lower electrode. Table 3 shows a full-width half maximum (FWHM) of a rocking curve of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$, and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Example 15

In this example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 5 except that the tapered angle of the end faces of the lower electrode was changed. Tables 1 and 2 show the material and thickness of each layer at the vibration portion, and a full-width half maximum (FWHM) of a rocking curve of the Ru/Mo/Ti-layered lower electrode. Table 3 shows a full-width half maximum (FWHM) of a rocking curve of the AlN thin film. The piezoelectric properties on the piezoelectric thin film resonator were evaluated in the same manner as in Example 5. Table 4 shows a basic frequency of thickness vibration, an electromechanical coupling coefficient $k_t^2$, an acoustic quality factor Q, etc. of the obtained piezoelectric thin film resonator.

Comparative Example 1

In this comparative example, a piezoelectric thin film resonator having the structure shown in FIGS. 1 and 2 was manufactured as follows. Specifically, the piezoelectric thin film resonator shown in FIGS. 1 and 2 was manufactured by similar methods to those in Example 1 except that the materials and thicknesses of the lower and upper insulating layers, and the materials and thicknesses of the lower and upper electrodes were changed, for example the lower insulating layer was made of $SiO_2$ formed by thermal oxidation, the contact layer of the lower electrode was made of Cr, and the lower electrode was made of Mo. Tables 1 and 2 show the material and thickness of each layer at the vibration portion. Table 3 shows a crystallinity of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$, and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Comparative Example 2

In this comparative example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the materials and thicknesses of the lower and upper insulating layers, and the materials and thicknesses of the lower and upper electrodes were changed. Tables 1 and 2 show the material and thickness of each layer at the vibration portion. Table 3 shows a crystallinity of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Comparative Example 3

In this comparative example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the material and thickness of the lower insulating layer, and the materials and thicknesses of the lower and upper electrodes were changed, and the upper insulating layer was not formed. Tables 1 and 2 show the material and thickness of each layer at the vibration portion. Table 3 shows a crystallinity of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Comparative Example 4

In this comparative example, a piezoelectric thin film resonator having the structure shown in FIGS. 3 and 4 was manufactured as follows. Specifically, the piezoelectric thin film resonator shown in FIGS. 3 and 4 was manufactured by similar methods to those in Example 3 except that the materials and thicknesses of the lower and upper insulating layers, and the materials and thicknesses of the lower and upper electrodes were changed. Tables 1 and 2 show the material and thickness of each layer at the vibration portion. Table 3 shows a crystallinity of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

Comparative Examples 5 and 6

In each of these comparative examples, a piezoelectric thin film resonator having the structure shown in FIGS. 1 and 2 was manufactured as follows. Specifically, the piezoelectric thin film resonator shown in FIGS. 1 and 2 was manufactured by similar methods to those in Comparative example 1 except that the material and thickness of the lower insulating layer, and the materials and thicknesses of the lower and upper electrodes were changed, and the upper insulating layer was not formed. Tables 1 and 2 show the material and thickness of each layer at the vibration portion. Table 3 shows a crystallinity of the AlN thin film.

Further, a GSG micro prober manufactured by Cascade Microtech Inc. and a network analyzer were used to measure an impedance characteristic between the electrode terminals 15b and 17b of the piezoelectric thin film resonator. In addition, an electromechanical coupling coefficient $k_t^2$ was obtained from measured values of the resonance frequency $f_r$ and anti-resonance frequency $f_a$, and acoustic quality factors Q of a resonance peak and an anti-resonance peak were obtained from peak waveforms (each being a peak width at a position distant by 3 dB from a peak top) of the resonance peak and the anti-resonance peak in the impedance characteristic. To evaluate environmental resistance, a frequency shift was measured after being left under conditions of high temperature and high humidity of 85° C.—R. H. 85% for 200 hours. Table 4 shows a basic frequency of thickness vibration, an electromechanical coupling coefficient $k_t^2$, an acoustic quality factor Q, etc. of the obtained piezoelectric thin film resonator.

TABLE 1

| | Material, thickness, properties of lower electrode | | | | | | | | | | | | |
|---|---|---|---|---|---|---|---|---|---|---|---|---|---|
| | Lower insulating layer | | | Contact layer | | 1st layer (lower side) | | | 2nd layer (upper side) | | | Surface roughness | End face Tapered | Product |
| | Material | Thickness d5 (nm) | Thickness d1 + d2 (nm) | Ratio d2/d1 | Material | Thickness (nm) | Material | Thickness d1 (nm) | FWHM (deg) | Material | Thickness d2 (nm) | FWHM (deg) | RMS (nm) | angle θ (deg) | θ *RMS |
| Example 1 | Al2O3 | 220 | 190 | 1.11 | — | — | Mo | 90 | 2.0 | Ru | 100 | 2.0 | 1.0 | 21.8 | 22.0 |
| Example 2 | AlN | 150 | 250 | 1.50 | — | — | Mo | 100 | 1.6 | Ru | 150 | 1.8 | 1.5 | 13.7 | 20.0 |
| Example 3 | AlN | 100 | 270 | 1.35 | — | — | Mo | 115 | 1.4 | Ru | 155 | 1.3 | 1.7 | 6.3 | 10.7 |
| Example 4 | AlN | 30 | 350 | 1.33 | — | — | Mo | 150 | 1.7 | Ru | 200 | 1.6 | 2.1 | 4.7 | 9.9 |
| Example 5 | AlN | 50 | 400 | 1.16 | — | — | Mo | 185 | 1.4 | Ru | 215 | 1.2 | 1.7 | 4.8 | 8.0 |
| Example 6 | Al2O3 | 70 | 270 | — | — | — | — | — | — | Ru | 270 | 1.4 | 1.6 | 5.0 | 8.0 |
| Example 7 | Si3N4 | 60 | 315 | — | — | — | — | — | — | Ru | 315 | 2.2 | 1.9 | 5.7 | 11.0 |
| Example 8 | Si3N4 | 90 | 260 | — | — | — | Mo | 260 | 2.3 | — | — | — | 1.5 | 12.7 | 19.4 |
| Example 9 | AlN | 80 | 255 | 1.44 | Ti | 35 | Mo | 90 | 1.2 | Ru | 130 | 1.2 | 1.5 | 14.0 | 20.8 |
| Example 10 | 3Al2O3•2SiO2 | 40 | 360 | — | Cr | 30 | — | — | — | Ru | 330 | 1.8 | 2.0 | 5.2 | 10.1 |
| Example 11 | Al2O3 | 20 | 270 | 1.08 | — | — | Mo | 130 | 2.5 | Ru | 140 | 2.4 | 2.6 | 8.5 | 21.9 |
| Example 12 | 3Al2O3•2SiO2 | 380 | 220 | — | Ti | 50 | W | 220 | 2.7 | — | — | — | 2.7 | 7.4 | 19.8 |
| Example 13 | MgSiO3 | 100 | 230 | 0.77 | — | — | Mo | 130 | 2.2 | Ru | 100 | 2.7 | 2.3 | 9.0 | 20.3 |
| Example 14 | MgSiO3 | 50 | 220 | 1.10 | — | — | Mo | 105 | 2.0 | Ru | 115 | 2.5 | 2.2 | 9.4 | 20.6 |
| Example 15 | AlN | 50 | 400 | 1.11 | — | — | Mo | 190 | 1.4 | Ru | 210 | 1.2 | 1.7 | 2.4 | 4.0 |
| Comparative example 1 | SiO2 | 280 | 170 | 0 | Cr | 45 | Mo | 125 | 3.4 | — | — | — | 3.5 | 13.9 | 48.6 |
| Comparative example 2 | AlN | 40 | 185 | — | — | — | Mo | 185 | 3.0 | — | — | — | 3.1 | 9.3 | 28.6 |
| Comparative example 3 | Al2O3 | 30 | 170 | — | — | — | — | — | — | Ru | 170 | 4.7 | 3.3 | 6.5 | 21.4 |
| Comparative example 4 | AlN | 40 | 142 | — | — | — | Mo | 142 | 3.2 | — | — | — | 3.2 | 9.7 | 31.4 |
| Comparative example 5 | SiO2 | 290 | 375 | — | Ti | 35 | W | 340 | 4.1 | — | — | — | 4.1 | 12.6 | 51.4 |
| Comparative example 6 | None | 0 | 140 | — | Al | 40 | Mo | 100 | 3.6 | — | — | — | 3.1 | 14.8 | 46.4 |

*Thicknesses of insulating layer in diaphragm are listed

TABLE 2

| | Material, thickness, properties of upper electrode | | | | | | Upper and lower electrodes | Upper insulating layer | | Upper and lower insulating layers Thickness |
|---|---|---|---|---|---|---|---|---|---|---|
| | Thickness | | 3r layer (lower side) | | 4th layer (upper side) | | Thickness ratio | | | |
| | d3 + d4 (nm) | Ratio d4/d3 | Material | Thickness d3 (nm) | Material | Thickness d4 (nm) | FWHM of Ru (deg) | (d3 + d4)/(d1 + d2) | Material | Thickness d6 (nm) | ratio d6/d5 |
| Example 1 | 265 | — | Mo | 265 | — | — | — | 1.39 | Al2O3 | 440 | 2.00 |
| Example 2 | 275 | — | — | — | Ru | 275 | 2.4 | 1.10 | AlN | 270 | 1.80 |
| Example 3 | 195 | 1.3 | Ru | 110 | W | 85 | 1.9 | 0.72 | AlN | 220 | 2.20 |
| Example 4 | 230 | 1.1 | Mo | 111 | Ru | 119 | 2.3 | 0.66 | AlN | 120 | 4.00 |
| Example 5 | 300 | 1.4 | W | 125 | Ru | 175 | 1.9 | 0.75 | AlN | 85 | 1.70 |
| Example 6 | 270 | 1.3 | Mo | 120 | Ru | 150 | 2.1 | 1.00 | Al2O3 | 160 | 2.29 |
| Example 7 | 220 | 1.1 | W | 105 | Ru | 115 | 2.7 | 0.70 | Si3N4 | 150 | 2.50 |
| Example 8 | 390 | 1.2 | Mo | 180 | Ru | 210 | 2.7 | 1.50 | Si3N4 | 170 | 1.89 |
| Example 9 | 280 | — | Mo | 280 | — | — | — | 1.10 | AlN | 170 | 2.13 |
| Example 10 | 245 | 1.1 | Mo | 115 | Ru | 130 | 2.3 | 0.68 | 3Al2O3·2SiO2 | 100 | 2.50 |
| Example 11 | 160 | — | W | 160 | — | — | — | 0.59 | Al2O3 | 200 | 10.00 |
| Example 12 | 240 | 0.8 | Mo | 135 | Ru | 105 | 2.8 | 1.09 | 3Al2O3·2SiO2 | 120 | 0.32 |
| Example 13 | 255 | — | Mo | 255 | — | — | — | 1.11 | MgSiO3 | 30 | 0.30 |
| Example 14 | 385 | — | Mo | 385 | — | — | — | 1.75 | MgSiO3 | 660 | 13.20 |
| Example 15 | 300 | 1.3 | W | 130 | Ru | 170 | 2.0 | 0.75 | AlN | 85 | 1.70 |
| Comparative example 1 | 300 | — | Mo | 145 | Au | 155 | — | 1.76 | SiO2 | 200 | 0.71 |
| Comparative example 2 | 200 | — | Mo | 200 | — | — | — | 1.08 | Al2O3 | 120 | 3.00 |
| Comparative example 3 | 190 | — | Mo | 190 | — | — | — | 1.12 | none | 0 | 0.00 |
| Comparative example 4 | 138 | — | — | — | Ru | 138 | 5.2 | 0.97 | SiO2 | 150 | 3.75 |
| Comparative example 5 | 270 | — | W | 125 | Au | 145 | — | 0.72 | none | 0 | 0.00 |
| Comparative example 6 | 475 | — | Ti | 25 | Pt | 450 | — | 3.39 | none | 0 | 0.00 |

* Thicknesses of insulating layer in diaphragm are listed

TABLE 3

| | Piezoelectric thin film manufacturing conditions and characteristics | | | | | | | | |
|---|---|---|---|---|---|---|---|---|---|
| | Ru electrode layer forming conditions | | | | Thin film depositing conditions | | XPS spectra | Crystal orientation rocking curve | X-ray diffraction | Crater-like separate growth |
| | Film depositing conditions | | Specific resistance μΩ·cm | | Nitrogen con- | Substrate | Oxygen | | | |
| | Deposition Speed (nm/s) | Substrate temperature (°C.) | Lower electrode | Upper electrode | centration (vol %) | temperature (°C.) | concentration (Atm %) | FWHM (deg) | c-axis length (nm) | at electrode end portions |
| Example 1 | 1.2 | 260 | 10.4 | 9.3 | 30 | 350 | <0.5 | 1.7 | 0.49785 | None |
| Example 2 | 1.2 | 280 | 9.8 | 12.3 | 35 | 300 | <0.5 | 1.2 | 0.49813 | None |
| Example 3 | 1.2 | 350 | 8.6 | 10.4 | 25 | 325 | <0.5 | 1.0 | 0.49758 | None |
| Example 4 | 2.0 | 330 | 9.6 | 10.8 | 35 | 340 | <0.5 | 1.4 | 0.49813 | None |
| Example 5 | 1.2 | 370 | 8.3 | 10.3 | 50 | 315 | <0.5 | 1.1 | 0.49895 | None |
| Example 6 | 1.2 | 340 | 9.9 | 10.6 | 50 | 305 | <0.5 | 0.9 | 0.49905 | None |
| Example 7 | 1.2 | 250 | 11.0 | 11.4 | 25 | 250 | <0.5 | 1.8 | 0.49758 | None |
| Example 8 | — | — | 9.3 | 11.4 | 25 | 240 | <0.5 | 1.5 | 0.49758 | None |
| Example 9 | 1.2 | 380 | 7.3 | 9.3 | 45 | 340 | <0.5 | 1.2 | 0.49868 | None |
| Example 10 | 2.0 | 300 | 10.1 | 10.9 | 35 | 280 | <0.5 | 1.3 | 0.49813 | None |
| Example 11 | 2.0 | 250 | 11.6 | 9.6 | 45 | 370 | <0.5 | 1.9 | 0.49868 | None |
| Example 12 | — | — | 9.9 | 11.4 | 30 | 250 | <0.5 | 1.8 | 0.49785 | None |
| Example 13 | 2.0 | 230 | 11.2 | 9.9 | 50 | 270 | <0.5 | 1.7 | 0.49895 | None |
| Example 14 | 2.0 | 240 | 11.2 | 9.9 | 30 | 270 | <0.5 | 1.7 | 0.49785 | None |
| Example 15 | 1.2 | 370 | 8.3 | 10.3 | 50 | 315 | <0.5 | 1.2 | 0.49890 | None |
| Comparative example 1 | — | — | 11.3 | 10.8 | 45 | 345 | 1.2 | 2.6 | 0.49868 | Occurred |
| Comparative example 2 | — | — | 13.8 | 12.1 | 55 | 270 | 1.0 | 2.3 | 0.49913 | None |
| Comparative example 3 | 2.0 | 140 | 22.6 | 12.1 | 45 | 240 | 1.9 | 3.6 | 0.49858 | None |

TABLE 3-continued

| | Ru electrode layer forming conditions | | | Piezoelectric thin film manufacturing conditions and characteristics | | | | | |
|---|---|---|---|---|---|---|---|---|---|
| | Film depositing conditions | | Specific resistance μΩ·cm | Thin film depositing conditions | | XPS spectra | Crystal orientation rocking curve | X-ray diffraction | Crater-like separate growth |
| | Deposition Speed (nm/s) | Substrate temperature (°C.) | Lower electrode / Upper electrode | Nitrogen concentration (vol %) | Substrate temperature (°C.) | Oxygen concentration (Atm %) | FWHM (deg) | c-axis length (nm) | at electrode end portions |
| Comparative example 4 | — | — | 14.3 / 23.3 | 50 | 290 | 1.6 | 2.4 | 0.49885 | Slightly |
| Comparative example 5 | — | — | 14.1 / 10.8 | 45 | 260 | 1.7 | 3.2 | 0.49878 | None |
| Comparative example 6 | — | — | 20.8 / 27.4 | 55 | 260 | <0.5 | 2.8 | 0.49923 | Occurred |

TABLE 4

| | Structures of piezoelectric thin film resonator | | Characteristics of piezoelectric thin film resonator | | | | | | | |
|---|---|---|---|---|---|---|---|---|---|---|
| | Figure showing structure | Thickness of piezoelectric thin film (μm) | Resonance frequency (GHz) | Anti-resonance frequency (GHz) | Electro-mechanical coupling coefficient $k_t^2$ (%) | Acoustic quality factor Q value Resonance peak | Anti-resonance peak | Insertion loss I.L. (dB) | Spurious signal in resonance characteristic | Environmental resistance frequency shift (MHz) |
| Example 1 | FIG. 1, 2 | 1.00 | 1.964 | 2.016 | 6.27 | 1350 | 1180 | 0.09 | Very weak | <0.5 MHz |
| Example 2 | FIG. 1, 2 | 1.32 | 1.897 | 1.950 | 6.65 | 1700 | 1250 | 0.09 | None | <0.5 MHz |
| Example 3 | FIG. 3, 4 | 1.50 | 1.940 | 1.990 | 6.12 | 1600 | 1700 | 0.09 | None | <0.5 MHz |
| Example 4 | FIG. 3, 4 | 1.15 | 2.125 | 2.188 | 7.05 | 1700 | 1380 | 0.09 | None | <0.5 MHz |
| Example 5 | FIG. 3, 4 | 1.40 | 1.856 | 1.909 | 6.73 | 1800 | 1290 | 0.07 | Very weak | 0.8 MHz |
| Example 6 | FIG. 3, 4 | 1.30 | 2.064 | 2.124 | 6.88 | 1800 | 1450 | 0.08 | Very weak | <0.5 MHz |
| Example 7 | FIG. 3, 4 | 1.25 | 2.128 | 2.186 | 6.49 | 1450 | 1140 | 0.09 | Very weak | <0.5 MHz |
| Example 8 | FIG. 1, 2 | 0.98 | 2.044 | 2.100 | 6.52 | 1500 | 1220 | 0.07 | Very weak | <0.5 MHz |
| Example 9 | FIG. 3, 4 | 1.20 | 2.021 | 2.076 | 6.41 | 1900 | 1470 | 0.07 | None | <0.5 MHz |
| Example 10 | FIG. 3, 4 | 1.40 | 1.911 | 1.964 | 6.68 | 1500 | 1140 | 0.08 | Very weak | <0.5 MHz |
| Example 11 | FIG. 3, 4 | 1.40 | 2.117 | 2.171 | 6.00 | 1080 | 950 | 0.14 | Very weak | <0.5 MHz |
| Example 12 | FIG. 3, 4 | 0.95 | 1.934 | 1.978 | 5.47 | 1160 | 740 | 0.13 | Very weak | <0.5 MHz |
| Example 13 | FIG. 3, 4 | 1.30 | 2.096 | 2.151 | 6.17 | 1300 | 770 | 0.12 | Intermediate | 1.2 MHz |
| Example 14 | FIG. 3, 4 | 0.85 | 1.593 | 1.631 | 5.58 | 1110 | 970 | 0.11 | Very weak | <0.5 MHz |
| Example 15 | FIG. 3, 4 | 1.40 | 1.861 | 1.910 | 6.23 | 1100 | 880 | 0.10 | Intermediate | 0.8 MHz |
| Comparative example 1 | FIG. 1, 2 | 0.90 | 1.829 | 1.870 | 5.28 | 900 | 280 | 0.18 | Intermediate | <0.5 MHz |
| Comparative example 2 | FIG. 3, 4 | 1.55 | 1.997 | 2.042 | 5.40 | 990 | 350 | 0.22 | Very weak | <0.5 MHz |
| Comparative example 3 | FIG. 3, 4 | 1.75 | 2.030 | 2.072 | 5.10 | 950 | 330 | 0.27 | Strong | >2 MHz |
| Comparative example 4 | FIG. 3, 4 | 1.75 | 2.002 | 2.046 | 5.25 | 970 | 460 | 0.37 | Intermediate | <0.5 MHz |
| Comparative example 5 | FIG. 1, 2 | 0.95 | 1.838 | 1.877 | 5.20 | 860 | 300 | 0.15 | Strong | >2 MHz |
| Comparative example 6 | FIG. 1, 2 | 1.40 | 1.790 | 1.830 | 0.00 | 795 | 320 | 0.28 | Strong | >2 MHz |

What is claimed is:

1. A piezoelectric thin film resonator comprising:
a substrate; and
a piezoelectric layered structure including a lower electrode, piezoelectric thin film and upper electrode formed on the substrate in this order so that a vibration space is formed below the piezoelectric layered structure, and a vibration portion including a part of the piezoelectric layered structure corresponding to the vibration space is formed;
wherein the lower electrode has a layered film constituted by a first layer containing one of a layer containing molybdenum as a major component and a layer containing tungsten as a major component and having a thickness d1 and a second layer containing a layer containing ruthenium as a major component and having a thickness d2, wherein d1 is 90 nm or more and 190 nm or less, d2 is greater than d1 and (d1+d2) is 150 nm or more and 450 nm or less,
wherein the layer containing ruthenium as a major component has a full-width half maximum (FWHM) of a rocking curve of a (0002) diffraction peak of ruthenium of 3.0° or less, the layer containing molybdenum as a major component has a full-width half maximum (FWHM) of a rocking curve of a (110) diffraction peak of molybdenum of 3.0° or less, and the layer containing tungsten as a major component has a full-width half maximum (FWHM) of a rocking curve of a (110) diffraction peak of tungsten of 3.0° or less, and wherein the piezoelectric thin film is an aluminum nitride thin film having a full-width half maximum (FWHM) of a rocking curve of a (0002) diffraction peak of 2.0° or less.

2. The piezoelectric thin film resonator as claimed in claim 1, wherein an end face of the lower electrode is in contact with the piezoelectric thin film, and a tapered angle of the end face of the lower electrode relative to the substrate is $5/R_B°$ or more and $30/R_B°$ or less, where surface roughness of an upper face of the lower electrode expressed by RMS variation is denoted by $R_B$ [nm].

3. The piezoelectric thin film resonator as claimed in claim 1, wherein the upper electrode is constituted by a metal thin film include at least one of a layer containing ruthenium as a major component, a layer containing molybdenum as a major component and a layer containing tungsten as a major component.

4. The piezoelectric thin film resonator as claimed in claim 1, wherein a ratio of a thickness of the upper electrode to a thickness of the lower electrode, (upper electrode thickness)/(lower electrode thickness), is 0.6 or more and 1.5 or less.

5. The piezoelectric thin film resonator as claimed in claim 1, wherein the vibration portion includes an insulating layer containing as a major component at least one selected from a group of aluminum nitride, aluminum oxynitride, aluminum oxide, silicon nitride, mullite, forsterite, zirconium oxide, hafnium oxide, niobium oxide, and tantalum oxide.

6. The piezoelectric thin film resonator as claimed in claim 5, wherein the insulating layer is formed in contact with a lower surface of the lower electrode.

7. The piezoelectric thin film resonator as claimed in claim 6, wherein the insulating layer has a thickness d5 of 25 nm or more and 300 nm or less.

8. The piezoelectric thin film resonator as claimed in claim 5, wherein the insulating layer is formed in contact with an upper surface of the upper electrode.

9. The piezoelectric thin film resonator as claimed in claim 8, wherein the insulating layer has a thickness d6 of 40 nm or more and 600 nm or less.

10. The piezoelectric thin film resonator as claimed in claim 1, wherein the piezoelectric layered structure further includes an internal electrode formed on the piezoelectric thin film and an additional piezoelectric thin film formed on the internal electrode, and the upper electrode is formed on the additional piezoelectric thin film, and wherein the internal electrode is constituted by a metal thin film including at least one of a layer containing ruthenium as a major component, a layer containing molybdenum as a major component and a layer containing tungsten as a major component.

11. The piezoelectric thin film resonator as claimed in claim 1, wherein the piezoelectric layered structure further includes an internal electrode formed on the piezoelectric thin film and an additional piezoelectric thin film formed on the internal electrode, and the upper electrode is formed on the additional piezoelectric thin film, and wherein an end face of the internal electrode is in contact with the additional piezoelectric thin film, and a tapered angle of the end face of the internal electrode relative to the piezoelectric thin film is $5/R_B°$ or more and $3/R_B°$ or less, where surface roughness of an upper face of the internal electrode expressed by RMS variation is denoted by $R_B$ [nm].

12. The piezoelectric thin film resonator as claimed in claim 1, wherein an acoustic quality factor (Q value) of an anti-resonance peak on an impedance curve is 1,000 or more.

13. A piezoelectric thin film device having the piezoelectric thin film resonator as claimed in claim 1.

14. A piezoelectric thin film resonator comprising:
a substrate; and
a piezoelectric layered structure including a lower electrode, piezoelectric thin film and upper electrode formed on the substrate in this order so that a vibration space is formed below the piezoelectric layered structure, and a vibration portion including a part of the piezoelectric layered structure corresponding to the vibration space is formed, wherein the upper electrode has a layered film constituted by a third layer containing one of a layer containing molybdenum as a major component and a layer containing tungsten as a major component and having a thickness d3 and a fourth layer containing a layer containing ruthenium as a major component and having a thickness d4, wherein d3 is 105 nm or more and 180 nm or less, d4 is greater than d3 and (d3+d4) is 150 nm or more and 450 nm or less, wherein the layer containing ruthenium as a major component has a full-width half maximum (FWHM) of a rocking curve of a (0002) diffraction peak of ruthenium of 3.0° or less, the layer containing molybdenum as a major component has a full-width half maximum (FWHM) of a rocking curve of a (110) diffraction peak of molybdenum of 3.0° or less, and the layer containing tungsten as a major component has a full-width half maximum (FWHM) of a rocking curve of a (110) diffraction of tungsten of 3.0° or less, and wherein the piezoelectric thin &n is an aluminum nitride thin film having a full-width half maximum (FWHW) of a rocking curve of a (0002) diffraction peak of 2.0° or less.

15. The piezoelectric thin film resonator as claimed in claim 14, wherein a ratio of a thickness of the upper electrode to a thickness of the lower electrode, (upper electrode thickness)/(lower electrode thickness), is 0.6 or more and 1.5 or less.

16. The piezoelectric thin film resonator as claimed in claim 14, wherein the vibration portion includes an insulating layer containing as a major component at least one selected h m a group of aluminum nitride, aluminum oxynitride, aluminum oxide, silicon nitride, mullite, forsterite, zirconium oxide, hafnium oxide, niobium oxide, and tantalum oxide.

17. The piezoelectric thin fib resonator as claimed in claim 16, wherein the insulating layer is formed in contact with a lower surface of the lower electrode.

18. The piezoelectric thin film resonator as claimed in claim 17, wherein the insulating layer has a thickness d5 of 25 nm or more and 300 nm or less.

19. The piezoelectric thin film resonator as claimed in claim 16, wherein the insulating layer is formed in contact with an upper surface of the upper electrode.

20. The piezoelectric thin film resonator as claimed in claim 19, wherein the insulating layer has a thickness d6 of 40 nm or more and 600 nm or less.

21. The piezoelectric thin film resonator as claimed in claim 14, wherein the piezoelectric layered structure further includes an internal electrode formed on the piezoelectric thin film and an additional piezoelectric thin film formed on the internal electrode, and the upper electrode is formed on the additional piezoelectric thin film, and wherein the internal electrode is constituted by a metal thin film including at least one of a layer containing ruthenium as a major component, a layer containing molybdenum as a major component and a layer containing tungsten as a major component.

22. The piezoelectric thin film resonator as claimed in claim 14, wherein the piezoelectric layered structure further includes an internal electrode formed on the piezoelectric thin film and an additional piezoelectric thin film formed on the internal electrode, and the upper electrode is formed on the additional piezoelectric thin film, and wherein an end face of the internal electrode is in contact with the additional piezoelectric thin film, and a tapered angle of the end face of the internal electrode relative to the piezoelectric thin film is $5/R_B°$ or more and $30/R_B°$ or less, where surface roughness of an upper face of the internal electrode expressed by RMS variation is denoted by $R_B$ [nm].

23. The piezoelectric thin film resonator as claimed in claim 14, wherein an acoustic quality factor (Q value) of an anti-resonance peak on an impedance curve is 1,000 or more.

24. A piezoelectric thin film device having the piezoelectric thin film resonator as claimed in claim 14.

25. A piezoelectric thin film resonator comprising:
a substrate; and
a piezoelectric layered structure including a lower electrode, piezoelectric thin film and upper electrode formed on the substrate in this order so that a vibration space is formed below the piezoelectric layered structure, and a vibration portion including a part of the piezoelectric layered structure corresponding to the vibration space is formed,
wherein the lower electrode is constituted by a metal thin film including one of a layer containing molybdenum as a major component and a layer containing tungsten as a major component, wherein an end face of the lower electrode is in contact with the piezoelectric thin film, and a tapered angle of the end face of the lower electrode relative to the substrate is $5/R_B°$ or more and $30/R_B°$ or less, where surface roughness of an upper face of the lower electrode expressed by RMS variation is denoted by $R_B$ [nm],
wherein the upper electrode is constituted by a metal thin film including a layer containing ruthenium as a major component, the layer containing ruthenium as a major component having a full-width ha. maximum (FWHM) of a rocking curve of a (0002) diffraction peak of ruthenium of 3.0° or less, and wherein the piezoelectric thin film is a c-axis oriented aluminum nitride thin film, which is in contact with the layer containing ruthenium as a major component, having a full-width half maximum (FWHM) of a rocking curve of a (0002) diffraction peak of 2.0° or less.

26. The piezoelectric thin film resonator as claimed in claim 25, wherein a ratio of a thickness of the upper electrode to a thickness of the lower electrode, (upper electrode thickness)/(lower electrode thickness), is 0.6 or more and 1.5 or less.

27. The piezoelectric thin film resonator as claimed in claim 25, wherein the vibration portion includes an insulating layer containing as a major component at least one selected from a group of aluminum nitride, aluminum oxynitride, aluminum oxide, silicon nitride, mullite, forsterite, zirconium oxide, hafium oxide, niobium oxide, and tantalum oxide.

28. The piezoelectric thin film resonator as claimed in claim 27, wherein the insulating layer is formed in contact with a lower surface of the lower electrode.

29. The piezoelectric thin film resonator as claimed in claim 28, wherein the insulating layer has a thickness d5 of 25 nm or more and 300 nm or less.

30. The piezoelectric thin film resonator as claimed in claim 27, wherein the insulating layer is formed in contact with an upper surface of the upper electrode.

31. The piezoelectric thin film resonator as claimed in claim 30, wherein the insulating layer has a thickness d6 of 40 nm or more and 600 nm or less.

32. The piezoelectric thin film resonator as claimed in claim 25, wherein the piezoelectric layered structure further includes an internal electrode formed on the piezoelectric thin film and an additional piezoelectric thin film formed on the internal electrode, and the upper electrode is formed on the additional piezoelectric thin film, and
wherein the internal electrode is constituted by a metal thin film including at least one of a layer containing ruthenium as a major component, a layer containing molybdenum as a major component and a layer containing tungsten as a major component.

33. The piezoelectric thin film resonator as claimed in claim 25, wherein the piezoelectric layered structure further includes an internal electrode formed on the piezoelectric thin film and an additional piezoelectric thin film formed on the internal electrode, and the upper electrode is formed on the additional piezoelectric thin film, and
wherein an end face of the internal electrode is in contact with the additional piezoelectric thin film, and a tapered angle of the end face of the internal electrode relative to the piezoelectric thin film is $5/R_B°$ or more and $30/R_B°$ or less, where surface roughness of an upper face of the internal electrode expressed by RMS variation is denoted by $R_B$ [nm].

34. The piezoelectric thin film resonator as claimed in claim 25, wherein an acoustic quality factor (Q value) of an anti-resonance peak on an impedance curve is 1,000 or more.

35. A piezoelectric thin film device having the piezoelectric thin film resonator as claimed in claim 25.

* * * * *